United States Patent
Chou et al.

(10) Patent No.: US 7,439,133 B2
(45) Date of Patent: Oct. 21, 2008

(54) MEMORY STRUCTURE AND METHOD OF MANUFACTURING A MEMORY ARRAY

(75) Inventors: Ming-Hung Chou, Hsin-Chu (TW); Fu-Chia Shone, Taipei (TW)

(73) Assignee: Skymedi Corporation, Hsinchu (TW)

( * ) Notice: Subject to any disclaimer, the term of this patent is extended or adjusted under 35 U.S.C. 154(b) by 480 days.

(21) Appl. No.: 11/306,548

(22) Filed: Jan. 2, 2006

(65) Prior Publication Data
US 2007/0152260 A1    Jul. 5, 2007

(51) Int. Cl.
*H01L 21/336* (2006.01)
(52) U.S. Cl. .............. 438/258; 257/E21.691
(58) Field of Classification Search ........... 438/211, 438/258, 594; 257/E21.691
See application file for complete search history.

(56) References Cited

U.S. PATENT DOCUMENTS

| | | | |
|---|---|---|---|
| 4,302,766 A | 11/1981 | Guterman et al. | |
| 4,331,968 A | 5/1982 | Gosney, Jr. et al. | |
| 4,561,004 A | 12/1985 | Kuo et al. | |
| 4,622,656 A | 11/1986 | Kamiya et al. | |
| 4,803,529 A | 2/1989 | Masuoka | |
| 5,414,693 A | 5/1995 | Ma et al. | |
| 5,712,180 A | 1/1998 | Guterman et al. | |
| 6,103,573 A * | 8/2000 | Harari et al. | 438/257 |
| 6,512,263 B1 * | 1/2003 | Yuan et al. | 257/316 |
| 6,951,782 B2 * | 10/2005 | Ding | 438/594 |

* cited by examiner

*Primary Examiner*—Chandra Chaudhari
(74) *Attorney, Agent, or Firm*—Winston Hsu

(57) ABSTRACT

A memory structure formed between two doping regions in a semiconductor substrate includes two conductive blocks functioning as floating gates formed at two sides of a first conductive line functioning as a select gat and insulated from the first conductive line with two first dielectric spacers therebetween, wherein the two conductive blocks each have a raised top and raised parts of sides relative to the top of the first conductive line. A first dielectric layer is formed on the tops and the parts of the sides of the two conductive blocks. A second conductive line functioning as a word line is formed on the first dielectric layer, wherein the second conductive line has a part deposited between the two conductive blocks and is substantially perpendicular to the first conductive line and two doping region functioning as bit lines.

23 Claims, 28 Drawing Sheets

|    |            | SG₁ | SG₂ | SG₃ | WL₁ | WL₂  | WL₃ | DL₁ | DL₂  | DL₃  | Bulk |
|----|------------|-----|-----|-----|-----|------|-----|-----|------|------|------|
| T_L | Program   | 0V  | 1V  | 0V  | 0V  | 12V  | 0V  | 0V  | 5V   | 0V   | 0V   |
|    | Read       | 0V  | 3V  | 0V  | 0V  | 5V   | 0V  | 0V  | 0V   | 1.5V | 0V   |
|    | Erase (I)  | 0V  | 0V  | 0V  | 0V  | -18V | 0V  | 0V  | 0V   | 0V   | 0V   |
|    | Erase (II) | 0V  | 0V  | 0V  | 0V  | -10V | 0V  | 5V  | 5V   | 5V   | 0V   |
|    | Erase (III)| 0V  | 12V | 0V  | 0V  | 0V   | 0V  | 0V  | 0V   | 0V   | 0V   |
|    | Erase (IV) | F   | F   | F   | F   | 0V   | F   | F   | F    | F    | 22V  |
| T_R | Program   | 0V  | 1V  | 0V  | 0V  | 12V  | 0V  | 0V  | 0V   | 5V   | 0V   |
|    | Read       | 0V  | 3V  | 0V  | 0V  | 5V   | 0V  | 0V  | 1.5V | 0V   | 0V   |
|    | Erase (I)  | 0V  | 0V  | 0V  | 0V  | -18V | 0V  | 0V  | 0V   | 0V   | 0V   |
|    | Erase (II) | 0V  | 0V  | 0V  | 0V  | -10V | 0V  | 5V  | 5V   | 5V   | 0V   |
|    | Erase (III)| 0V  | 12V | 0V  | 0V  | 0V   | 0V  | 0V  | 0V   | 0V   | 0V   |
|    | Erase (IV) | F   | F   | F   | F   | 0V   | F   | F   | F    | F    | 22V  |

Fig. 28

MEMORY STRUCTURE AND METHOD OF MANUFACTURING A MEMORY ARRAY

BACKGROUND OF THE INVENTION

1. Field of the Invention

The present invention is related to a non-volatile memory structure and, more particularly, to a symmetrical and self-aligned non-volatile memory structure with a high cell density and an improved coupling ratio.

2. Description of the Prior Art

Erasable programmable read only memories (EPROMs) and electrically erasable programmable read only memories (EEPROMs) are well known non-volatile memory devices capable of storing data, as well as erasing and rewriting data, as desired.

The conventional non-volatile memory cells normally need high currents to operate, e.g., 200 microamperes (μA), for hot electron programming, and are not suitable for low-power devices that are currently the trend of chip development. Therefore, one form of an EEPROM device includes a so-called "split-gate" electrode that has been developed to obtain high efficiency and low current programming, where the programming current can be diminished to, for example, 1 μA.

Many EEPROM devices use two polysilicon layers (one for the formation of the floating gate and another for the formation of the control gate and possible electrical interconnects) whereas other EEPROM devices use three polysilicon layers. For example, U.S. Pat. No. 4,302,766 provides a first polysilicon layer serving as the floating gate, a second polysilicon layer serving as the control gate, and a third polysilicon layer coupled through an erase window to a portion of the first polysilicon layer for use during erasure of the cell. U.S. Pat. No. 4,331,968 also uses a third layer of polysilicon to form an erase gate, and U.S. Pat. Nos. 4,561,004 and 4,803,529 use three polysilicon layers in their own specific configurations.

U.S. Pat. No. 4,622,656 describes an EEPROM device in which a reduced programming voltage is provided by having a highly doped channel region under the select gate, and having the channel region under the floating gate being either lightly doped or doped to the opposite conductivity type, thereby providing a significant surface potential gap at the transition location of the channel.

U.S. Pat. No. 5,712,180 discloses a flash EEPROM cell layout as shown in FIG. 1, and the cross-sectional diagram of line A-A in FIG. 1 is shown in FIG. 2. EEPROM cell 101 includes a buried source region 102 and a buried drain region 103, each being buried by a relatively thick layer of dielectric 104 and 105, respectively. Channel region 106 is divided into a first portion 106-1 and a second portion 106-2. The first portion 106-1 is influenced by the polysilicon layer 109 and serves as a select gate, whereas the second portion 106-2 is influenced by a floating gate 107 formed of a polysilicon layer and which, in turn, is influenced by control gate 108 formed of a polysilicon layer. As is well known in the art, suitable dielectric layers such as thermally grown oxide are located between channel 106, polysilicon layer 109, and polysilicon layer 107 for insulation. Similarly, suitable dielectric layers such as oxide or composite oxide/nitride are formed between the three layers of polysilicon. Metal silicide can be used in place of one or more of the polysilicon layers 108 and 109. If desired, a highly-doped $P^+$ region 120 is used within channel 106-2 adjacent to buried drain region 103, so as to provide a stable threshold voltage of the memory transistor including channel 106-2.

U.S. Pat. No. 5,414,693 also discloses a flash EEPROM memory structure as shown in FIG. 3. The cell structure is formed in a P-doped substrate 206 with a drain 204 of a transistor 201 and a drain 205 of a transistor 202. The drains 204 and 205 serve as bit lines. The transistor 201 includes a floating gate 207a and an overlying control gate 208a. Likewise, the transistor 202 includes a floating gate 207b and a control gate 208b located thereon. A word line 209 extends over the two transistors 201 and 202 and forms the control gate 209a of the select gate between the floating gate transistors 201 and 202. The word line 209 serially connects the select gates in one row of a memory array and runs perpendicular to the bit lines in columns, i.e., the drains 204 and 205.

To sum up, the floating gates in U.S. Pat. No. 5,712,180 and U.S. Pat. No. 5,414,693 are completely defined by the control gates during control gate patterning, so the floating gates have to be larger than the select gate in width direction to allow alignment tolerance. Under such circumstances, the memory cell size could not be reduced significantly.

SUMMARY OF THE INVENTION

The objective of the present invention is to provide a memory structure for low power device applications, and this memory structure comprises competitive small memory cells and has an efficient coupling ratio so that the cell density can be increased effectively and the memory cells have an improved quality.

In order to achieve the above objective, a memory structure according to the present invention formed between two doping regions in a semiconductor substrate comprises a first conductive line, two conductive blocks, two first dielectric spacers, a first dielectric layer, and a second conductive line. The first conductive line is formed above the semiconductor substrate. The two conductive blocks are formed at the two sides of the first conductive line and insulated from the first conductive line with the two first dielectric spacers therebetween, wherein the two conductive blocks each have a raised top and raised parts of sides relative to the top of the first conductive line. The first dielectric layer is formed on the tops and the parts of the sides of the two conductive blocks. The second conductive line is formed on the first dielectric layer, wherein the second conductive line has a part deposited between the two conductive blocks and is substantially perpendicular to the first conductive line.

The above memory structure can be manufactured by the following method. The method for forming a memory array in one embodiment according to the present invention comprises the steps as follows. First, a semiconductor substrate is provided. A plurality of first conductive lines are defined on the semiconductor substrate, and the first conductive lines comprise a mask layer as an upper part and a first conductive layer as a lower part. Next, a spacer is formed at each side wall of the first conductive lines. A second conductive layer is formed on the semiconductor substrate between every two first conductive lines to form a plurality of second conductive lines. A plurality of diffused lines are formed in the semiconductor substrate between the first conductive lines where no second conductive layers are formed. A first dielectric layer is deposited over the first conductive lines and the semiconductor substrate. A CMP (chemical mechanical polishing) process is performed to planarize the first dielectric layer using the top of the first conductive lines as a stop layer. Then, the mask layer as the upper part of the first conductive lines is removed. A third conductive layer is filled as the upper part on the lower part of the first conductive lines, wherein the first conductive line and the third conductive layer have a total thickness more than the thickness of the second conductive line. Subsequently, part of the first dielectric layer is removed to expose a top and part of side surface of the third conductive layer of the first conductive lines. A second dielectric layer is formed on the exposed top and partial side surface of the third conductive layer of the first conductive lines. Finally, a fourth conductive layer is formed on the second dielectric layer and patterned to form a plurality of lines over the third conductive layer and the first conductive lines and perpendicular to the diffused lines and a plurality of conductive blocks are defined from the third conductive layer and the first conductive lines.

The method for forming a memory array in another embodiment according to the present invention comprises the steps as follows. A semiconductor substrate is provided. A plurality of first conductive lines are formed on the semiconductor substrate, and the conductive blocks comprise a first conductive layer and a mask layer as a cap layer. Next, a spacer is formed at each side wall of the first conductive lines. A second conductive layer is formed on the semiconductor substrate between every two first conductive lines to form a plurality of second conductive lines. The second conductive line has a thickness less than the thickness of the first conductive layer. A plurality of diffused lines are formed in the semiconductor substrate between the first conductive lines where no second conductive layers are formed. A first dielectric layer is deposited over the first conductive lines and the semiconductor substrate. A CMP process is performed to planarize the first dielectric layer using the top of the first conductive lines as a stop layer. The mask layer as the upper part of the first conductive lines is removed. Subsequently, part of the first dielectric layer and part of the spacers are removed to expose a top and part of side surface of the first conductive layer of the first conductive lines. A second dielectric layer is formed on the exposed top and part of side surface of the third conductive layer of the first conductive lines. Finally, a third conductive layer is formed on the second dielectric layer and patterned to form a plurality of lines over the first conductive lines and perpendicular to the diffused lines. A plurality of conductive blocks are defined from the first conductive lines.

The method for forming a memory array in still another embodiment according to the present invention comprises the steps as follows. A semiconductor substrate is provided. A plurality of first conductive lines are formed on the semiconductor substrate, wherein the first conductive lines comprise a mask layer as an upper part and a first conductive layer as a lower part. Next, a spacer is formed at each side of the first conductive lines. A second conductive layer is filled between the first conductive lines to form a plurality of second conductive lines, wherein the second conductive line has a top surface as high as the top surface of the first conductive lines. One of every two first conductive lines is removed. A plurality of diffused lines are formed in the semiconductor substrate between the second conductive lines where no first conductive layers are formed. The mask layer as an upper part of the first conductive lines are removed. Subsequently, a first dielectric layer is deposited over the second conductive lines, the first conductive layer of the first conductive lines, and the semiconductor substrate, and part of the dielectric layer is etched back and part of the spacers is etched to expose a top and part of side surface of the second conductive lines. A second dielectric layer is formed on the exposed top and part of side surface of the second conductive lines. Finally, a third conductive layer is formed on the second dielectric layer and patterned to form a plurality of lines over the second conductive lines and perpendicular to the diffused lines. A plurality of conductive blocks are defined from the second conductive lines.

The memory structure according to the present invention has a structure that the select gates are parallel to bit lines, and the word lines are perpendicular to select gates and bit lines, respectively. In addition, the floating gate has an increased area for the formation of the dielectric layer (e.g., ONO layer), such that the coupling ratio for the dielectric layer is increased, and the floating gate voltage can be accordingly increased to improve the properties of the memory cells. Furthermore, there is a wide and thick dielectric layer between two memory structures, such that neighbor capacitance is small and can be ignored.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 28 shows a table for the reading, programming, and erasing of memory cells $T_L$ and $T_R$ of an example according to the present invention.

DETAILED DESCRIPTION

Figure 1:
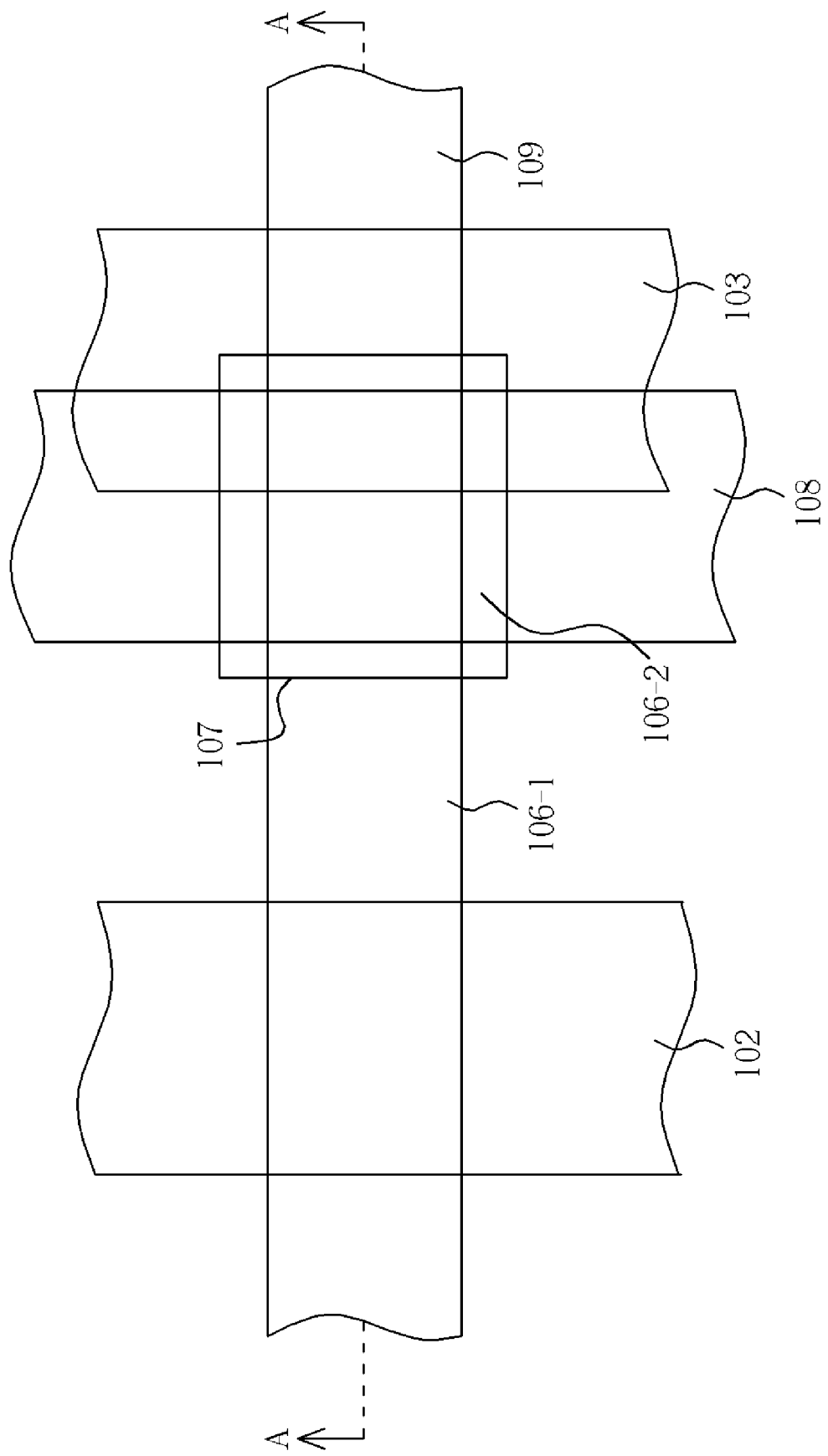
FIGS. 1 and 2 illustrate a known memory structure.
Figure 2:
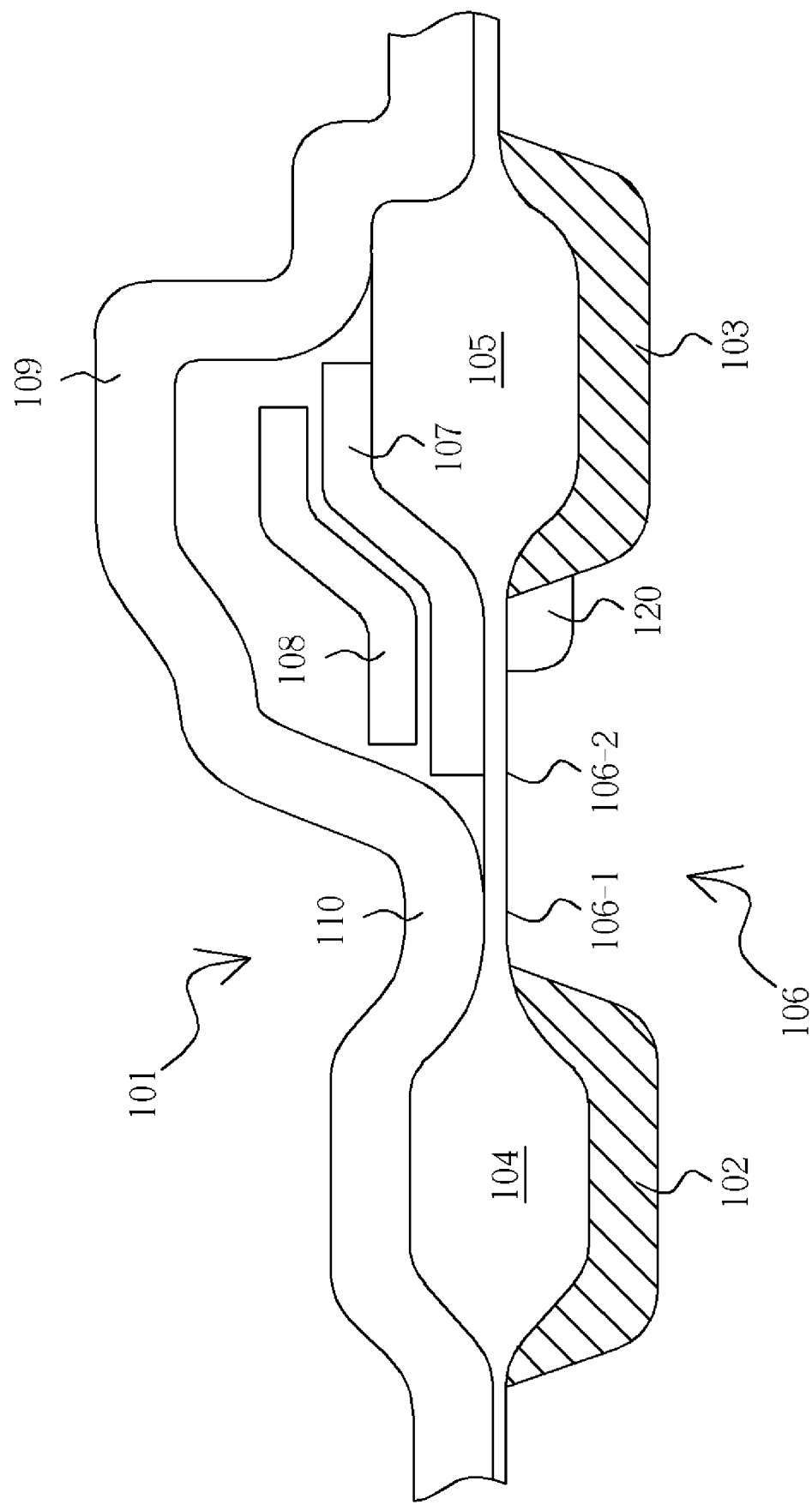
Figure 3:
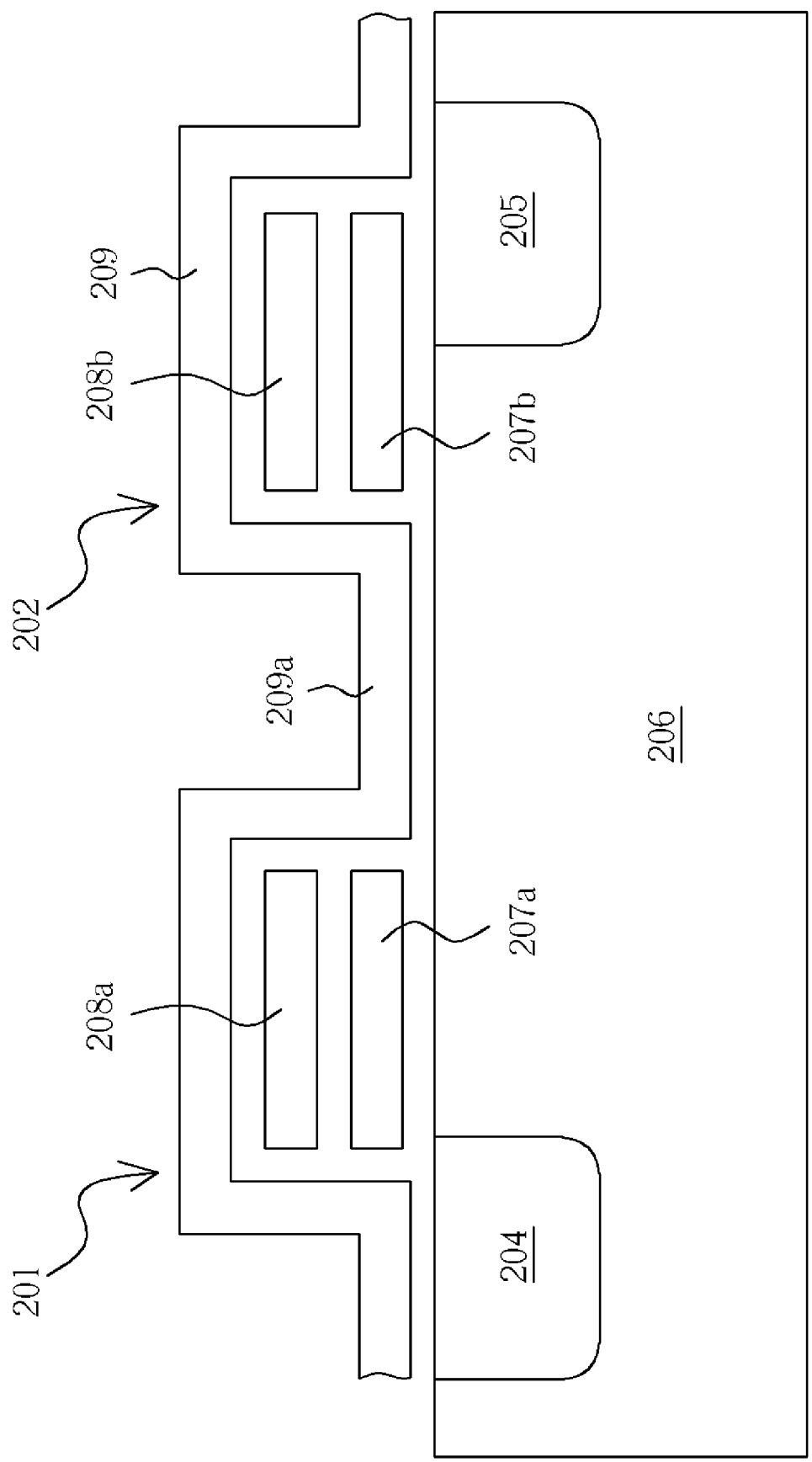
FIG. 3 illustrates another known memory structure.
Figure 4:
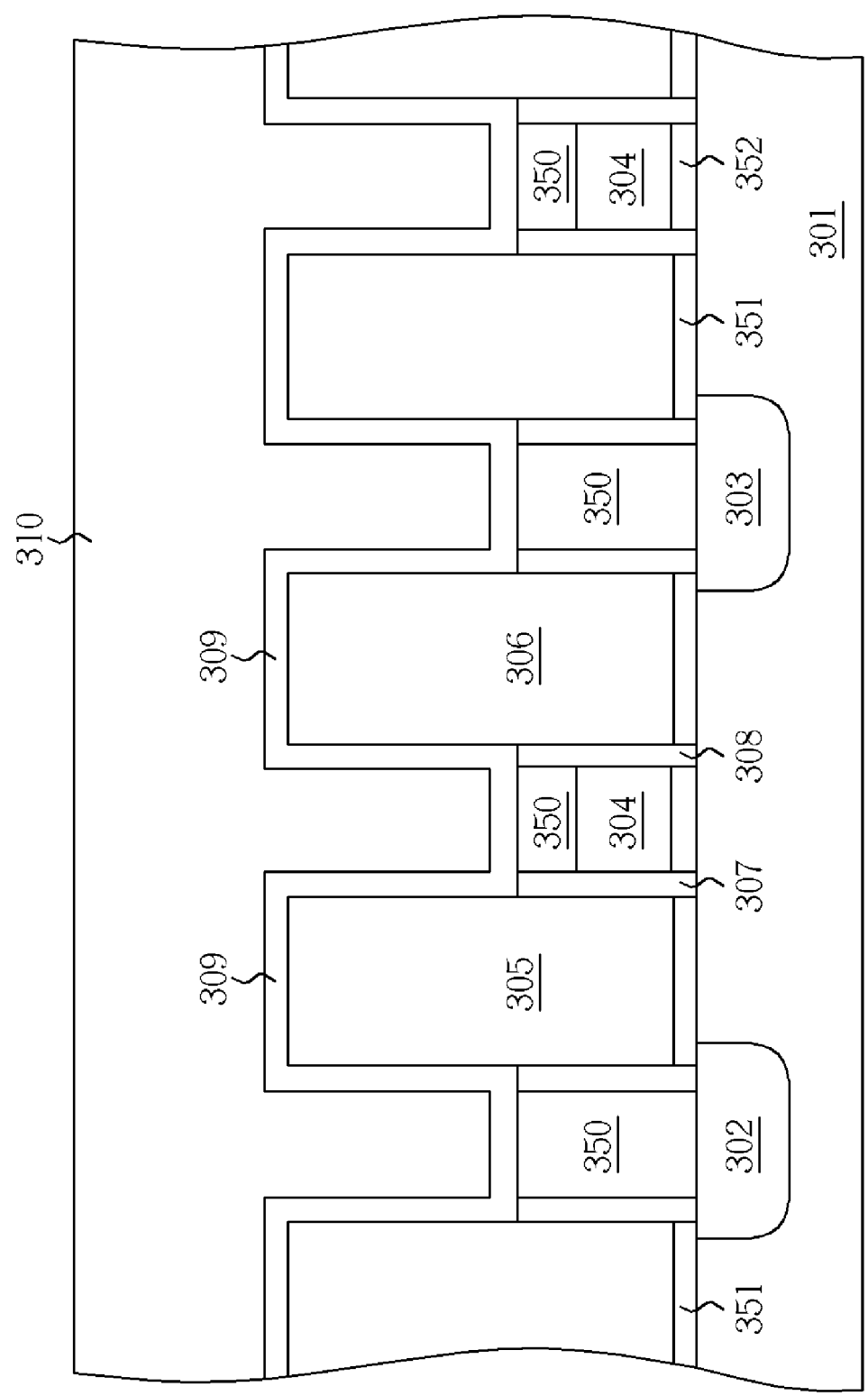
FIG. 4 illustrates a memory structure according to the present invention.

Please refer to FIG. 4, showing a memory structure according to the present invention. The memory structure is formed between two doping regions 302 and 303, which may comprise N+ dopants, e.g., arsenic ions with $1 \times 10^{14}$–$5 \times 10^{15}$ atoms/cm$^2$, on a P-type well 301 in a semiconductor substrate. The semiconductor substrate may comprise a triple well, i.e. a P-well above an N-well for the memory cell area, an N-well for a PMOS area as a peripheral circuit, and a P-well for an NMOS area as a peripheral circuit. The memory structure also can be formed on a N-type well in a semiconductor substrate, according to the electrical properties as desired.

The memory structure comprises a conductive line 304 deposited above the P-type well 301 in the semiconductor substrate. The conductive line 304 may comprise conductive material such as polysilicon or polysilicon/tungsten silicide (poly/WSi) and have a thickness between 500-1000 angstroms. Two conductive blocks 305, 306, as charge storage regions, are formed at the two sides of the conductive line 304. There are spacers 307, 308 deposited between the two conductive blocks 305, 306 and the conductive line 304, respectively, for insulation. The spacers may range from 100 to 300 angstroms. It should be noted that the two conductive blocks 305, 306 each have a raised top and raised parts of sides relative to the top of the conductive line 304. That is, the thickness of the conductive block 305 or 306 is more than the thickness of the conductive line 304. The conductive block may comprise polysilicon. A dielectric layer 309, which may comprise oxide or oxide/nitride/oxide (ONO), is deposited on the tops and partial sides of the two conductive blocks 305, 306, the conductive line 304, and the doping regions 302, 303. A conductive line 310 is formed on the first dielectric layer 309, with a part deposited in an indent between the two conductive blocks 305, 306, as the thickness of the conductive blocks 305, 306 is more than the thickness of the conductive line, and the conductive line 310 is substantially perpendicular to the conductive lines 304 and the doping regions 302, 303, respectively.

The conductive line 304 and the conductive blocks 305, 306 serve as a select gate and floating gates, respectively, such that the floating gates each have a thickness more than the thickness of the select gate, and thus the coupling ratio is improved. The doping regions 302, 303 and the conductive line 310 serve as bit lines and a word line, respectively. A second dielectric layer 351, which may comprise oxide or oxide/nitride/oxide and range from 70 to 110 angstroms, may be deposited between the conductive blocks 305, 306 and the semiconductor substrate. A third dielectric layer 352 may be deposited between the conductive line 304 and the semiconductor substrate. The conductive line may further comprise a cap layer comprising dielectric material 350, such that the cap layer is between the conductive line 304 and the first dielectric layer 309. There is further a layer of dielectric material 350 disposed between the doping regions 302, 303 and the first dielectric layer 309.

Further, with a view to increasing the word line integrity, a third conductive line substantially parallel to the second conductive line may be formed and insulated from the conductive line 310 with a dielectric spacer. A dielectric may be located between the third conductive line and the semiconductor substrate. As a result, the word line density will be almost doubled.

Figure 5:
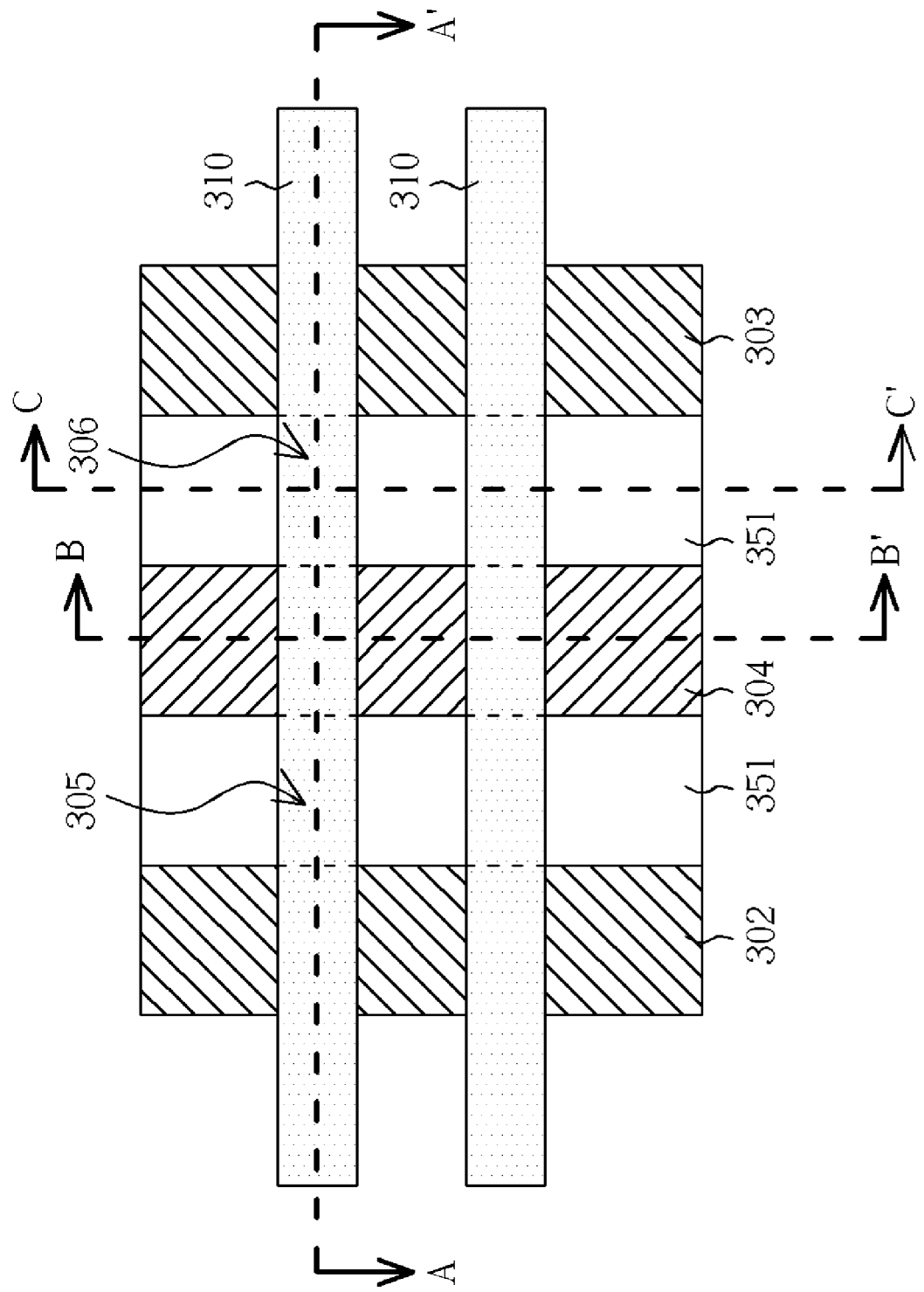
FIG. 5 illustrates an array layout in a top view of the memory structure shown in FIG. 4.

FIG. 5 shows a top view of the memory cell in FIG. 4. It should be noted that the conductive line 310 (word line) is perpendicular to the doping region 302 or 303 as a buried diffusion region (bit line), and the conductive line 304 as a select gate. The floating gates 305 and 306 represent as conductive blocks under the lines 310. Lines AA', BB', and CC' are cross-sectional lines for showing the cross sections of the memory cell, the select gate, and the floating gate, respectively.

Figure 6:
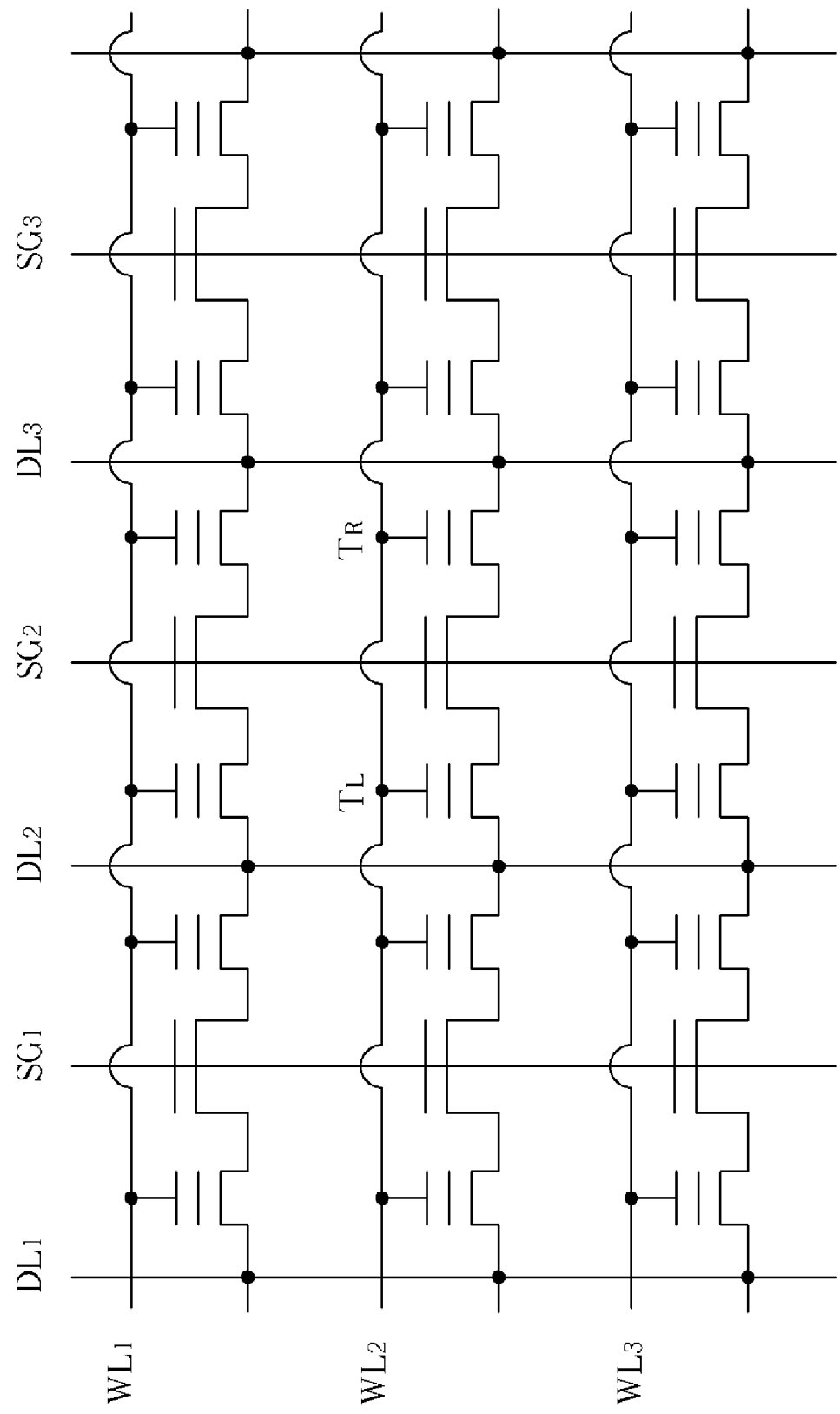
FIG. 6 illustrates the circuit schematic with reference to the memory array according to the present invention.

FIG. 6 illustrates the circuit schematic with reference to the memory structure in accordance with the present invention. Yet some components are renamed by their functionality: a data line (bit line) is denoted by $DL_x$, a select gate is denoted by $SG_x$, and a word line is denoted by $WL_x$. Floating gate cells at two sides of a select gate $SG_2$ are denoted by $T_L$ and $T_R$, respectively.

Figure 7:
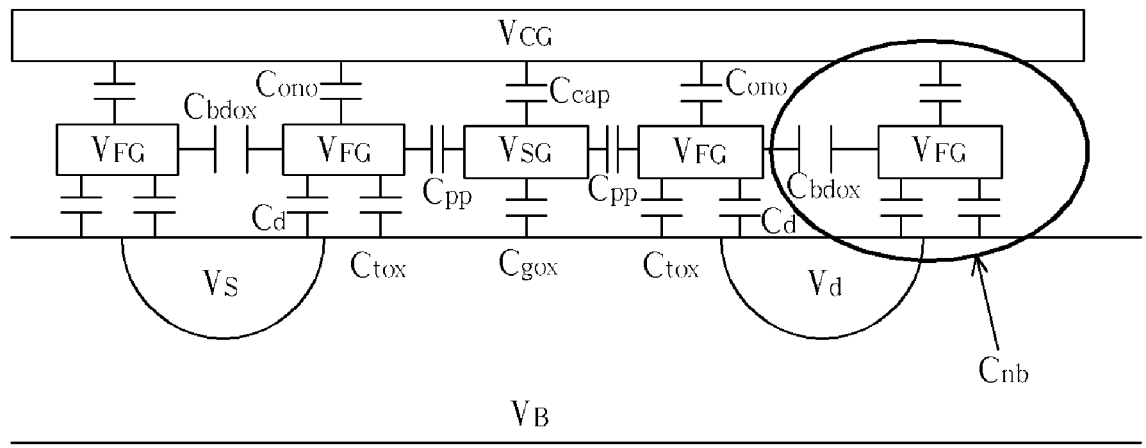
FIG. 7 illustrates the equivalent capacitive model with reference to the memory cell according to the present invention.
Figure 7:
Figure 7:
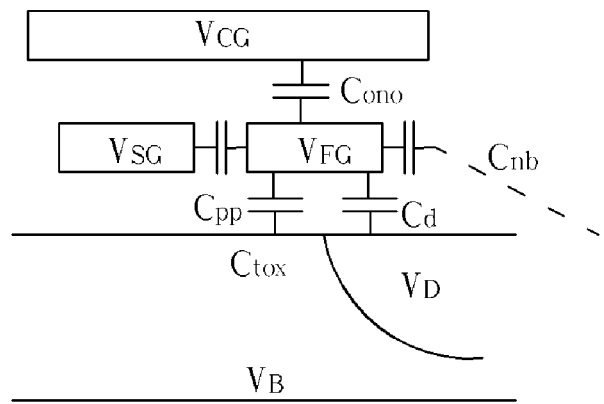

FIG. 7 shows an equivalent capacitive model and the simplified capacitive model of the memory structure according to the present invention. For floating gate voltage, $V_{FG}$, as:

$C_{tot} = C_{ono} + C_{tox} + C_d + C_{pp} + C_{nb}$ in which, $C_{tot}$: total capacitance
$C_{ono}$: oxide/nitride/oxide layer capacitance
$C_{tox}$: tunnel oxide layer capacitance
$C_d$: drain capacitance
$C_{pp}$: select gate capacitance
$C_{nb}$: neighbor capacitance, including buried line oxide layer capacitance $C_{bdox}$ while, substrate coupling ratio, $\alpha_B = C_{tox}/C_{tot}$
gate coupling ratio, $\alpha_{CG} = C_{ono}/C_{tot}$
drain coupling ratio, $\alpha_D = C_d/C_{tot}$
SG coupling ratio, $\alpha_{PP} = C_{pp}/C_{tot}$ therefore, $V_{FG} = \alpha_B * Vb + \alpha_{CG} * Vcg + \alpha_D * Vd + \alpha_{PP} * Vsg$ in which, $V_{FG}$: floating gate voltage
Vb: substrate voltage
Vcg: control gate voltage
Vd: drain voltage
Vsg: select gate voltage In view of the equation listed above, usually, the potential across tunnel oxide layer is hoped to be as high as possible, and therefore, $C_{ono}$ is hoped to be as high as possible, and $C_{nb}$ is as low as possible. $C_{tox}$, $C_d$, and $C_{pp}$ are determined by the cell requirement, and can only be tuned in a small range. Assuming $C_{nb}$ can be ignored, when the dielectric layer between the control gate and the floating gate has an increased area, the gate coupling ratio will be increased, and in turn, the floating gate voltage will increase. In the present invention, the floating gate 305 or 306 is formed to raise the height (the thickness), thus it has a relatively large area for dielectric layer 309 formation to increase the coupling ratio. The layer of dielectric material 350 above the doping region 303 comprises no conductive layers, such that the neighbor coupling can be minimized and be ignored.

A process for making a memory cell of the NMOS type in a first embodiment is exemplified as follows.

Figure 8:
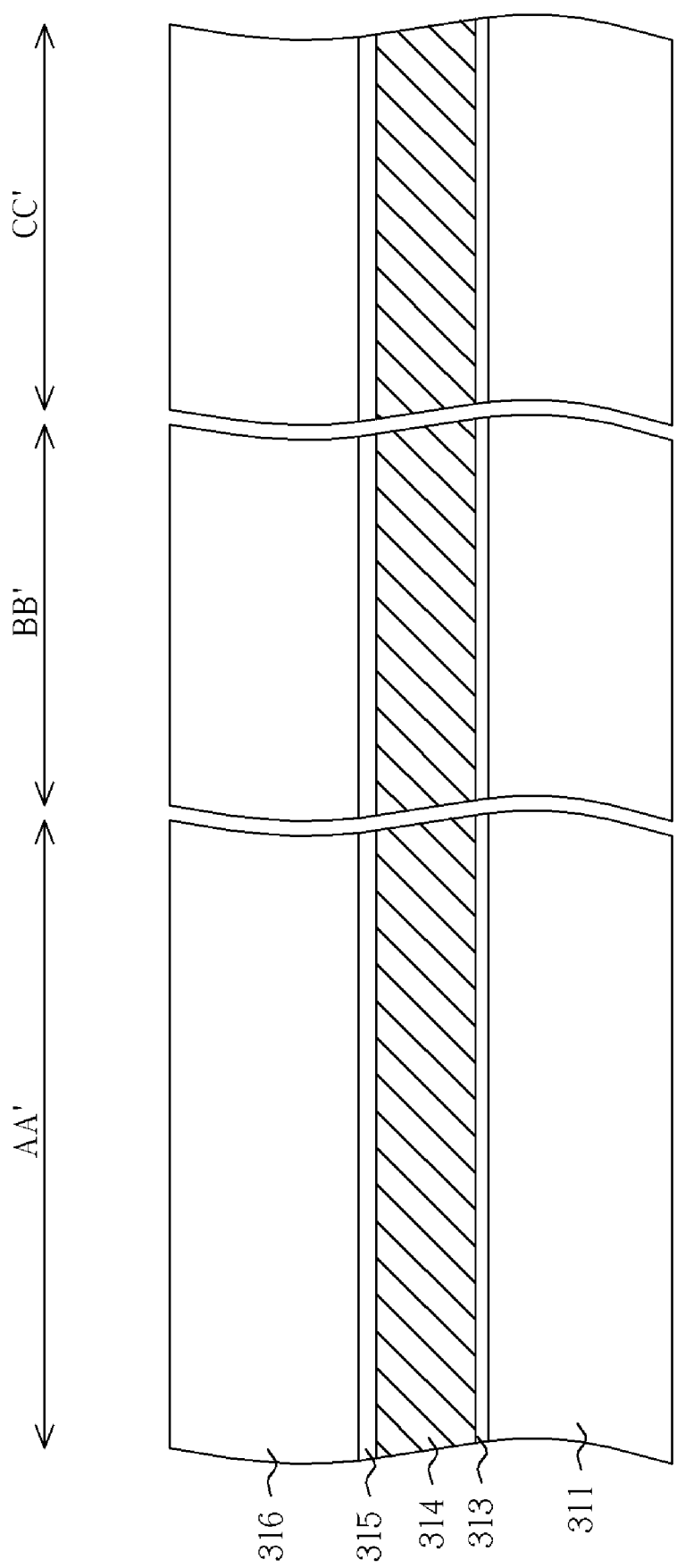
FIGS. 8 through 15 illustrate the processes of manufacturing the memory structure in one embodiment according to the present invention.

FIGS. 8-15 show the cross-sectional diagrams of lines AA', BB', and CC' as shown in FIG. 5, respectively, during the manufacturing process for the memory structure. As shown in FIG. 8, a semiconductor substrate is provided. A gate dielectric layer 313 may be first thermally grown on the surface of the semiconductor substrate, and followed by sequentially deposition of a conductive layer 314 and a mask layer comprising a cap layer of TEOS 315 and a cap layer of SiN 316.

Figure 9:
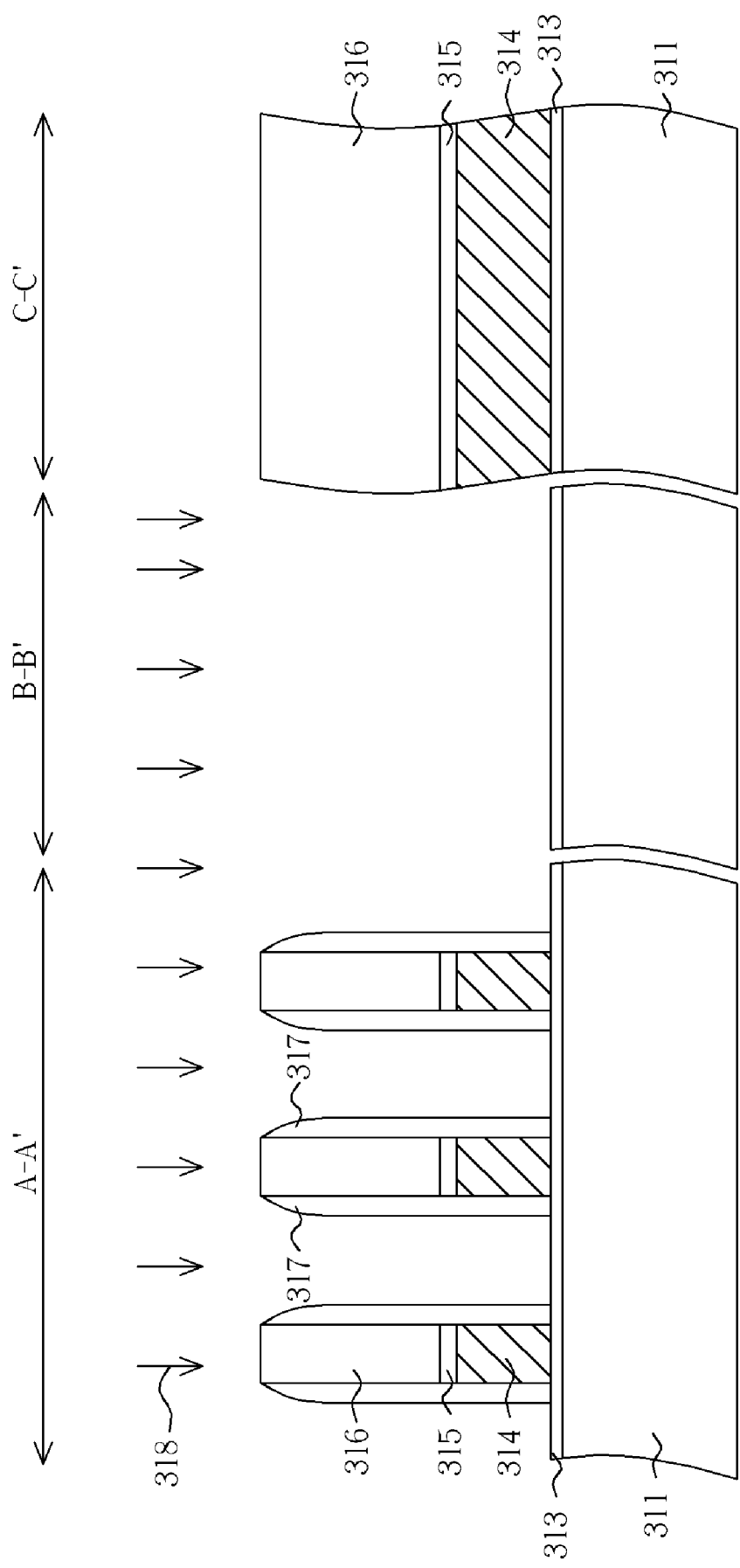

As shown in FIG. 9, a lithography process and an etching process are performed to remove a portion of the cap layer of TEOS 315, the cap layer of SiN 316, and the conductive layer 314 to define a plurality of conductive lines, which will serve as floating gates finally. The conductive line comprises an upper part including a cap layer of TEOS 315 and a cap layer of SiN 316 as a mask layer, and a lower part comprising the conductive layer 314. Next, an oxide layer is deposited on the semiconductor substrate to fill the trenches between the conductive lines by either oxidation or deposition of low pressure chemical vapor deposition (LPCVD) oxide, or high temperature oxide (HTO), and followed by etching back process, such as an anisotropic etching process, to form a spacer 317 at each side of the conductive blocks. Subsequently, an ion implanting step 318 is performed to give the memory structure a threshold voltage.

Figure 10:
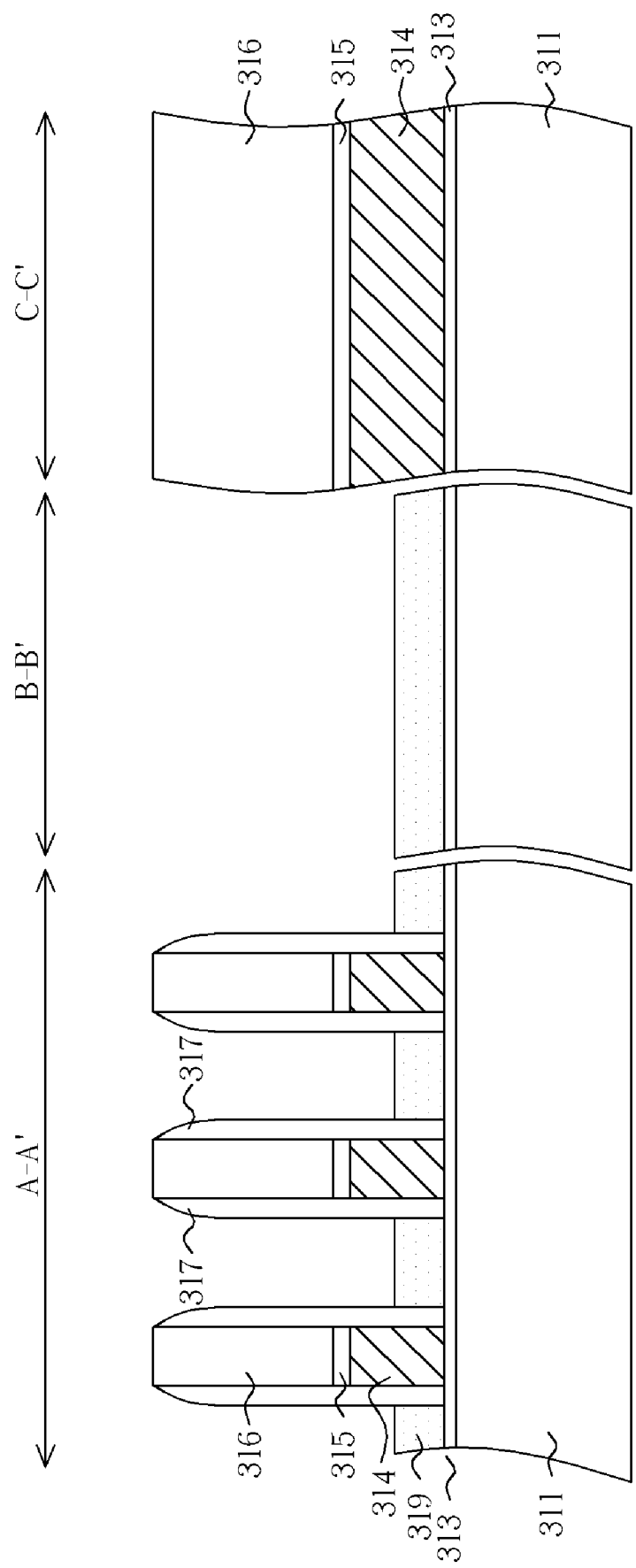

As shown in FIG. 10, a dielectric layer as a gate oxide layer may be further formed on the exposed semiconductor substrate for insulation of the select gate formed later on and the semiconductor substrate. Next, a conductive layer on the semiconductor substrate between every two conductive lines is formed by depositing a conductive material on the dielectric layer and the conductive blocks, chemically mechanically polishing the layer of the conductive material using the top of the conductive block as a stop layer, and etching back the layer of the conductive material to form a plurality of conductive lines 319 with a thickness less than the conductive layer 314 of the conductive lines.

Figure 11:
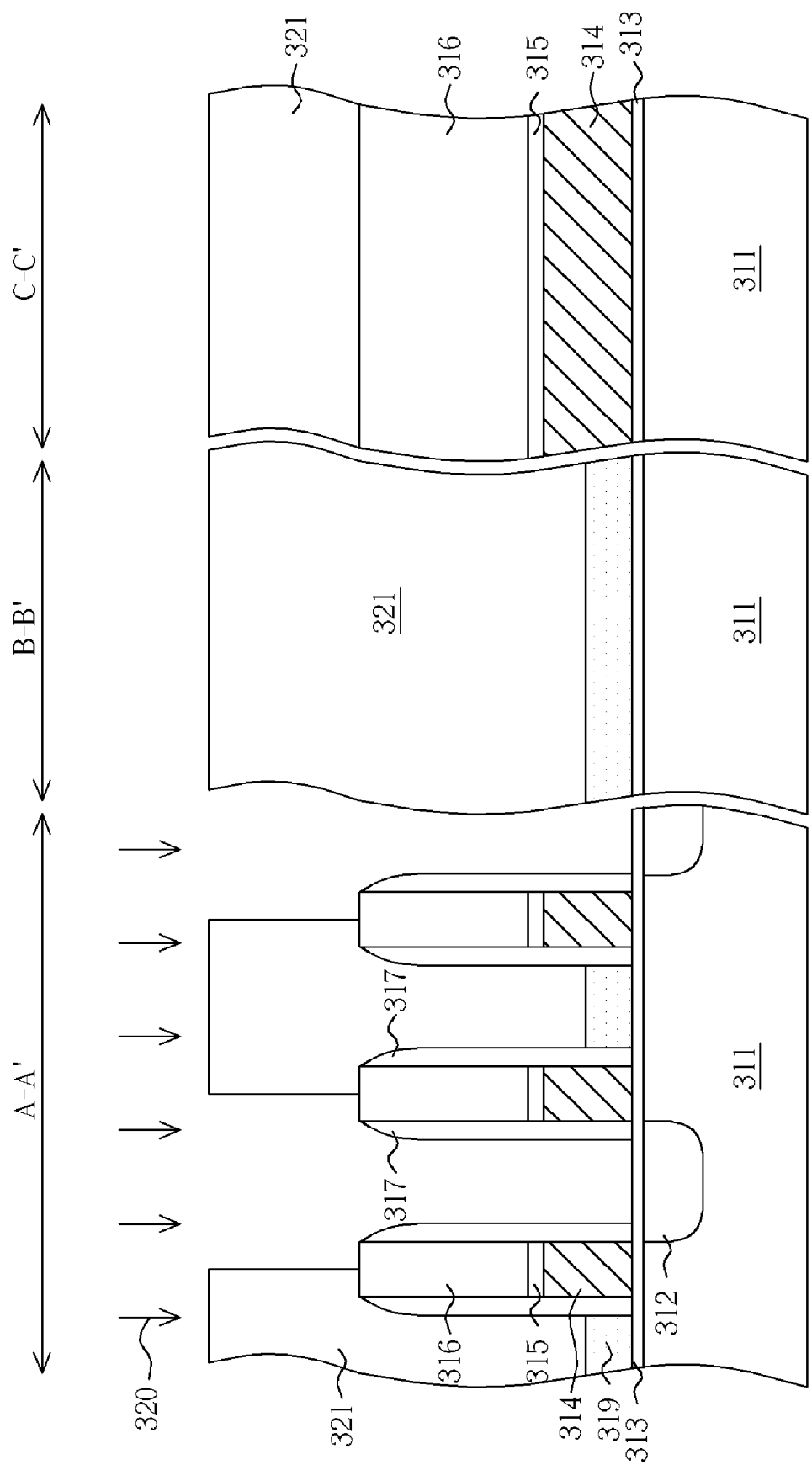

As shown in FIG. 11, a photo resist layer 321 is patterned for performing an etching process to remove the conductive lines 319 between two conductive lines. As a result, a conductive line 319 is retained on the semiconductor substrate between another two conductive lines. The conductive line 319 will serve as a select gate of the memory structure. Subsequently, an ion implantation 320, generally a N+ implantation, and an annealing process are performed on the P-well 311 of the semiconductor substrate to form doping regions 312, such as buried diffusion regions or bit lines, in the semiconductor substrate. Subsequently, the photo resist layer 321 is stripped away. As a result, there are two conductive lines 314 and one conductive line 319 formed on the semiconductor substrate between two doping regions 312.

Figure 12:
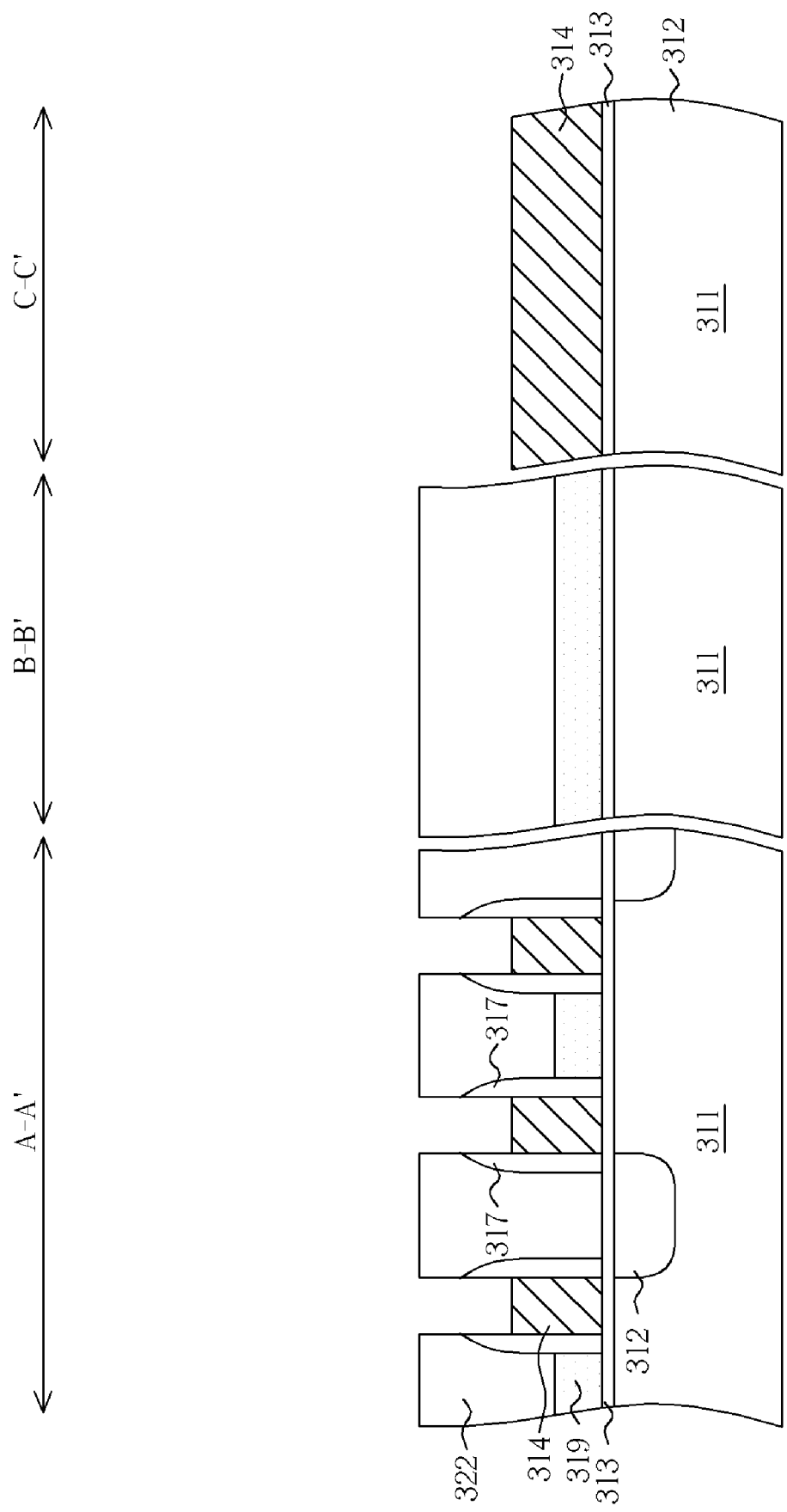

As shown in FIG. 12, a dielectric layer 322 is deposited on the semiconductor substrate and chemically mechanically polished back using the top of the cap layer of SiN 316 as a stop layer. Thereafter, the cap layer of TEOS 315 and the cap layer of SiN 316 of the conductive lines are removed using a wet etching process.

Figure 13:
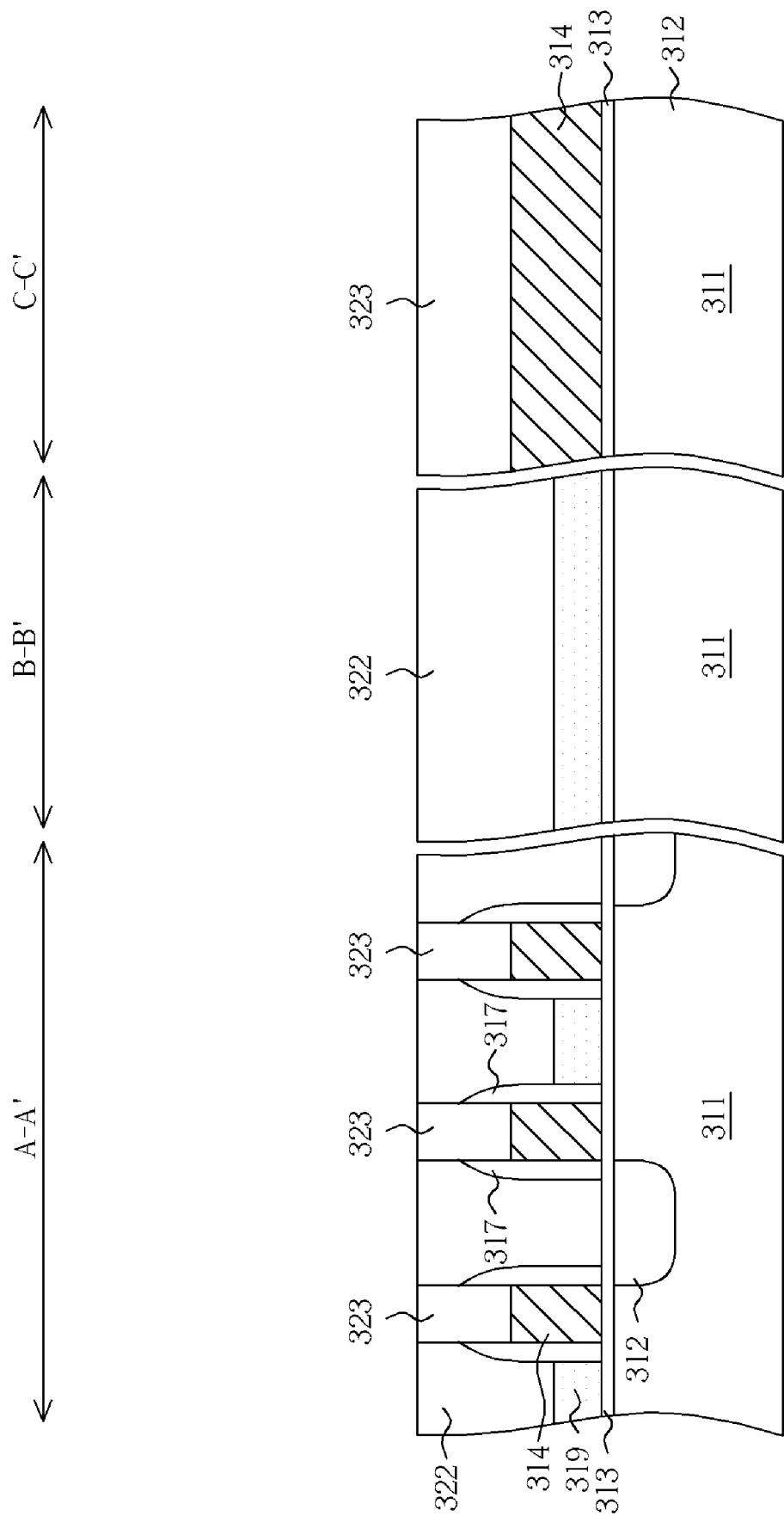

As shown in FIG. 13, a conductive material is deposited on the semiconductor substrate, filling the empty upper part of the conductive lines, and etched back using the dielectric layer 322 as a stop layer. The conductive material forms a conductive layer 323 as the upper part of the conductive blocks. As a result, the conductive lines as floating gates comprise two integrated conductive layers.

Figure 14:
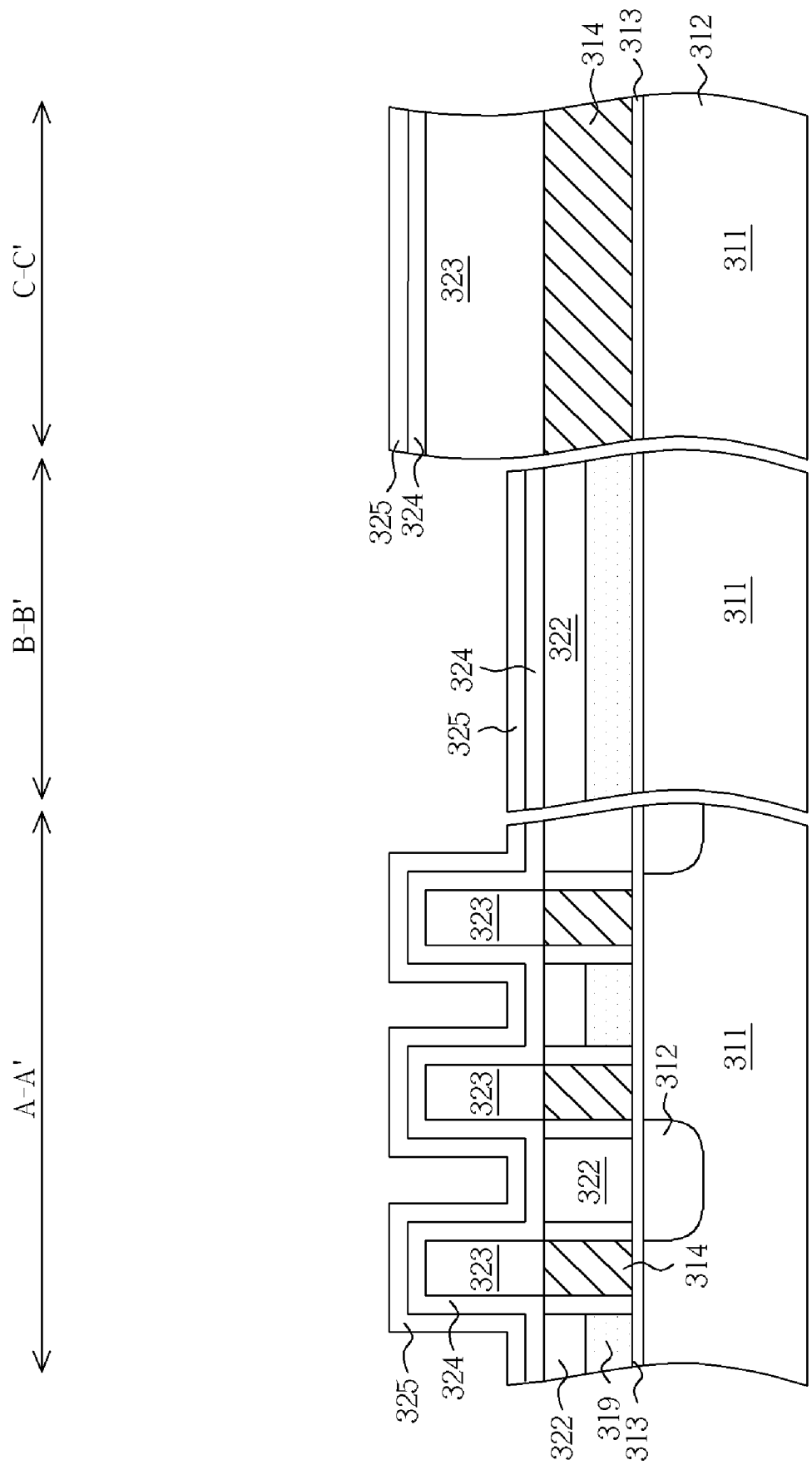

As shown in FIG. 14, the dielectric layer 322 is etched back to expose a part of the conductive lines, such as the top and partial sides of the conductive layer 323. A part of the dielectric layer 322 is retained on the top of the conductive lines 319 and above the doping regions. The thickness of the dielectric layer 322 on the conductive lines 319 functioning as select gates is preferably sufficient for the protection of the select gates in the later-on etching steps. Next, a dielectric layer 324, which may comprise oxide/nitride/oxide, is deposited on the exposed top and partial sides of the conductive layer 323 of the conductive blocks and the dielectric layer 322. Subsequently, a cap layer 325, which may comprise polysilicon, may be further deposited on the dielectric layer 324.

Figure 15:
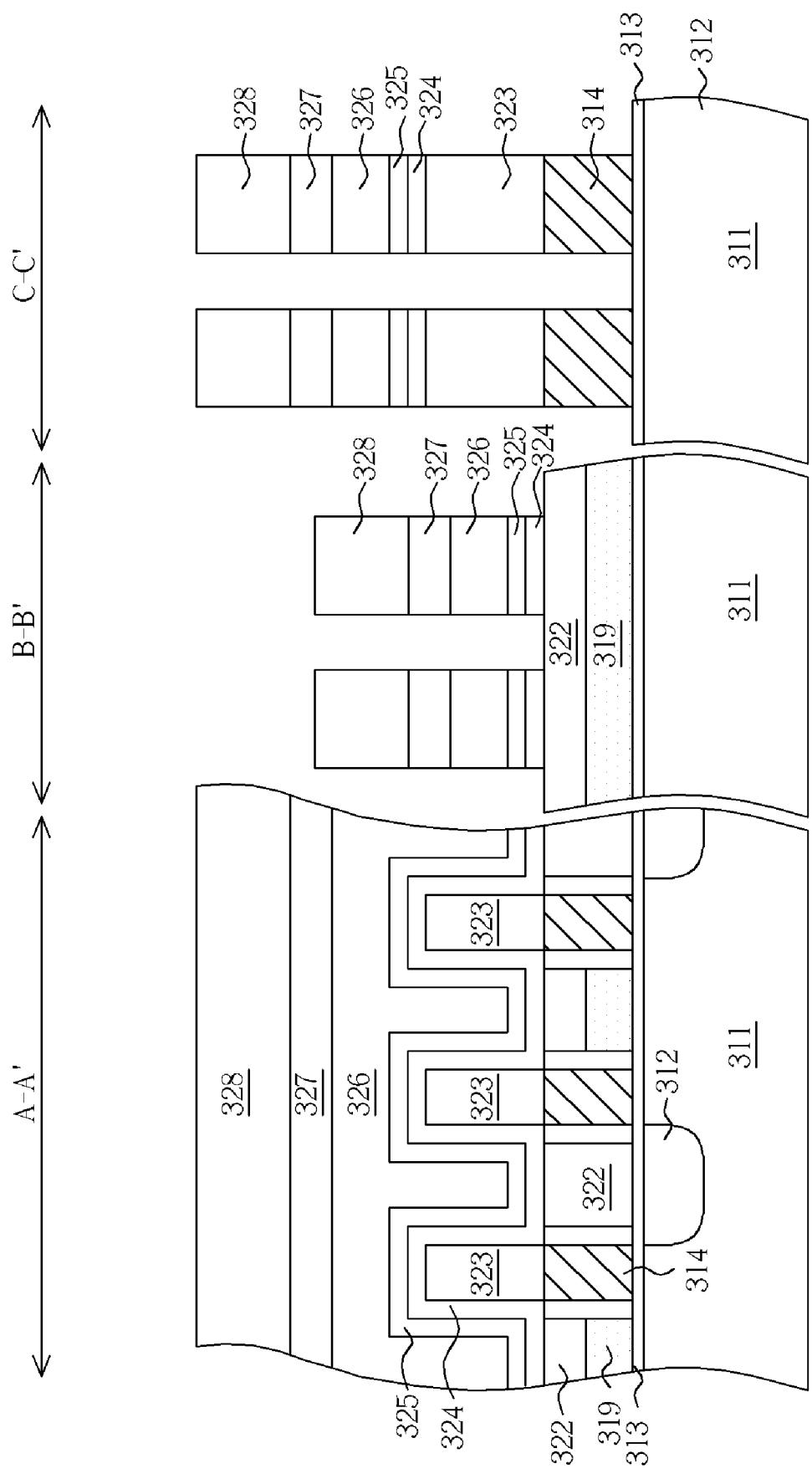

As shown in FIG. 15, finally, a conductive layer, such as a polysilicon layer 326/WSi layer 327/SiN layer 328, is deposited on the second dielectric layer 324 or the cap layer 325. Then, a SAMOS (self-aligned) etching process is performed to etch the SiN layer 328, the WSi layer 327, the polysilicon layer 326, the dielectric layer 324 (e.g. ONO), and the conductive layer 314, and stop at an oxide layer, to pattern a plurality of lines, such as word lines, perpendicular to the diffuse lines (doping regions 312). Simultaneously, the conductive lines defined from the conductive layer 314 are further defined as a plurality of conductive blocks for the function as floating gates. The etching selectivity for oxide should be good at end point, and the oxide (such as the dielectric layer 322 on the conductive line 319) between the control gate (word line) and the select gate is preferably thick enough to prevent the select gate from etching away during SAMOS etching process. After the SAMOS etching process, the SiN layer 328 is removed. After the removing processes, a gate re-oxidation may be performed to recovery some loss of oxide material.

It is noted that, in the first embodiment, the float gate is a stacked float gate and is first to be made in the manufacturing process.

A process for making a memory cell of the NMOS type in a second embodiment is exemplified as follows. The whole floating gate is first to be made. FIGS. 16-20 show the cross-sectional diagrams of lines AA', BB', and CC' as shown in FIG. 5, respectively, during the manufacturing process for the memory structure.

Figure 16:
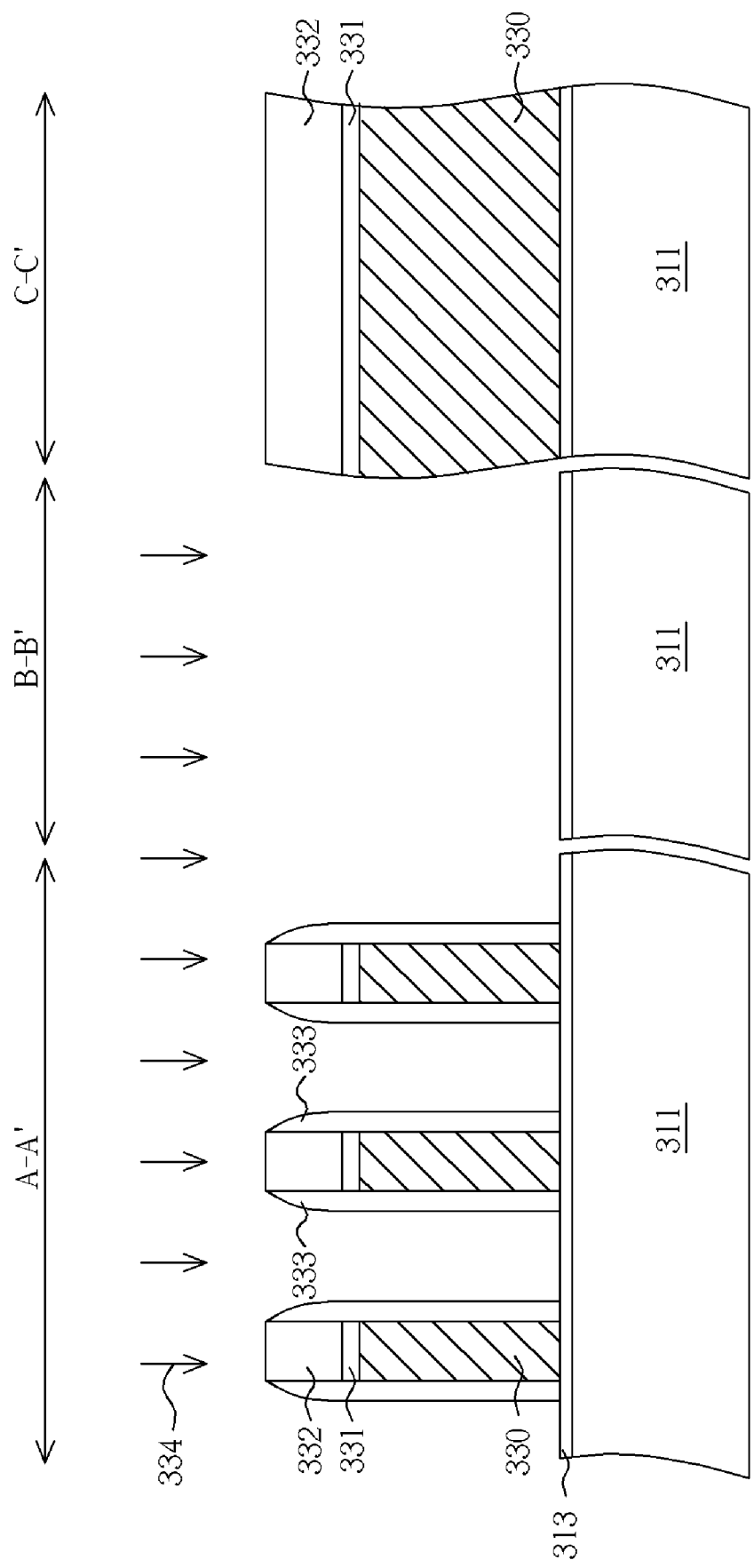
FIGS. 16 through 20 illustrate the processes of manufacturing the memory structure in another embodiment according to the present invention.

FIG. 16 shows a plurality of conductive lines comprising a conductive layer 330, a cap layer of TEOS 315 and a cap layer of SiN 316 as a mask layer on the semiconductor substrate similarly to the plurality of conductive lines shown in FIG. 9, except that the conductive layer 330 is much thicker than the conductive layer 314, such that the conductive blocks shown in FIG. 16 has a high aspect ratio. There are spacers 333 at the sides of the conductive lines. An ion implanting step 334 is performed to give the memory structure a threshold voltage. Next, a conductive layer 336 on the semiconductor substrate between every two conductive lines and the doping regions 312 are formed similarly to FIGS. 10 and 11.

Figure 17:
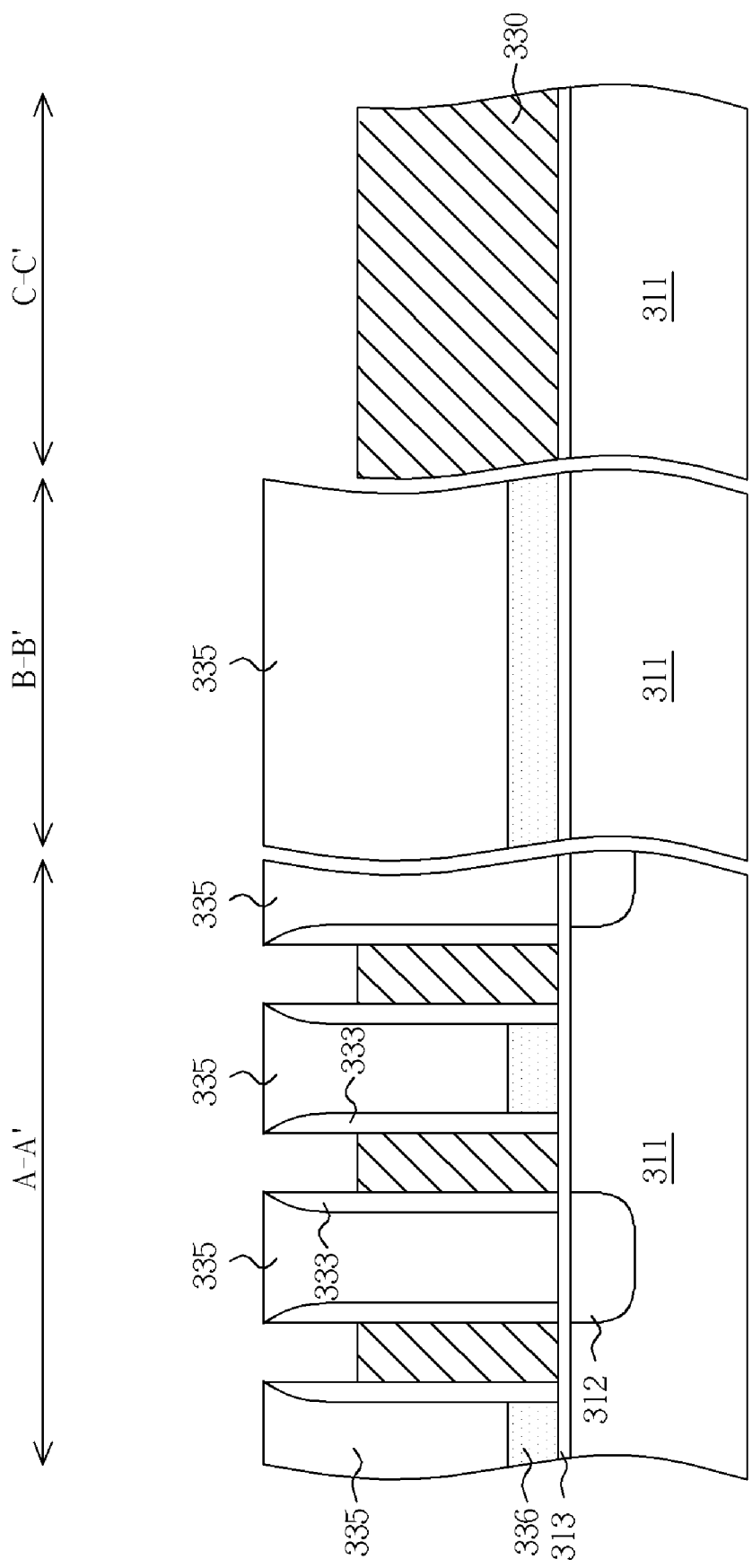
Figure 18:
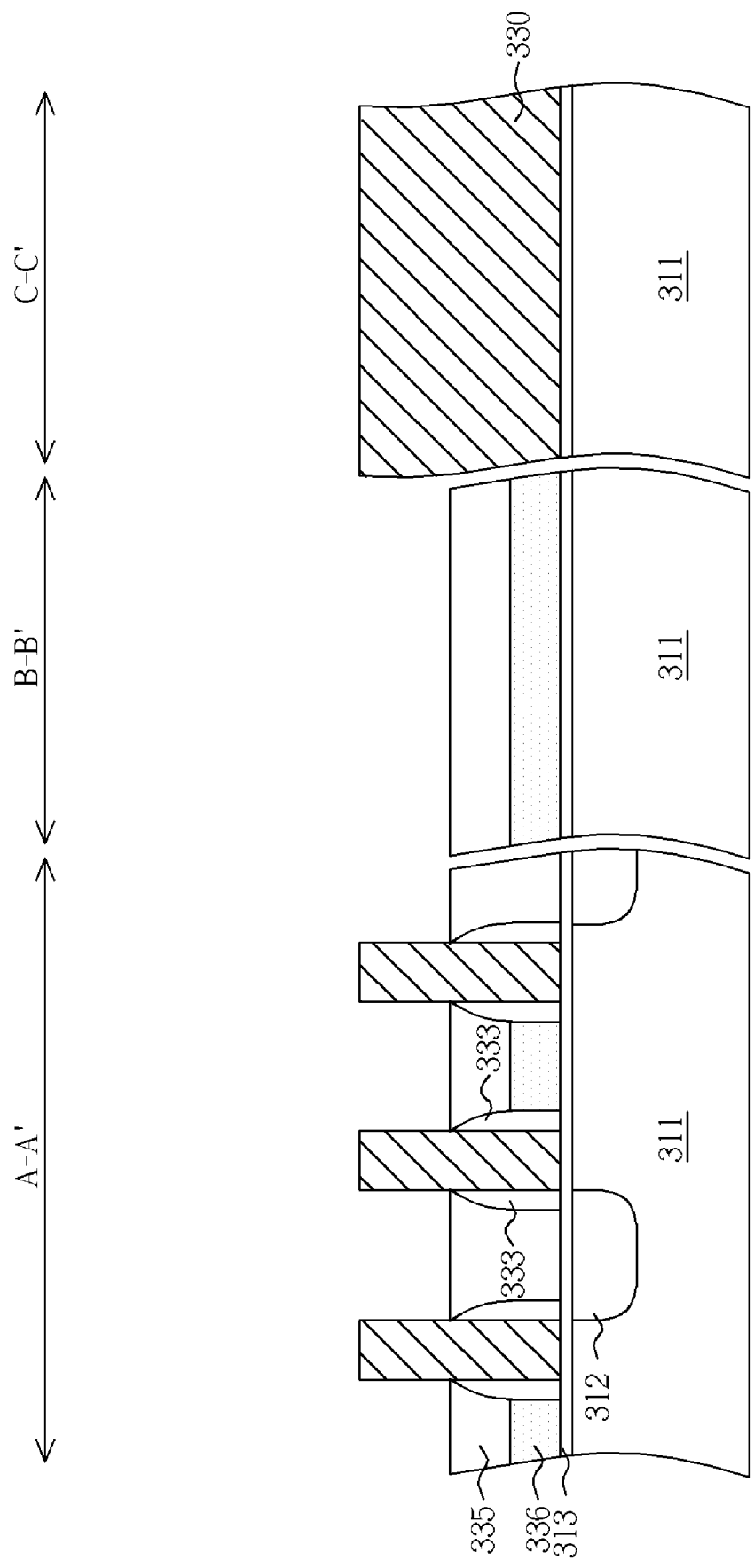

As shown in FIG. 17, a dielectric layer 335 is deposited on the semiconductor substrate and chemically mechanically polished back using the top of the cap layer of SiN 332 as a stop layer. Thereafter, the cap layer of TEOS 331 and the cap layer of SiN 332 of the conductive lines are removed using a wet etching process. As shown in FIG. 18, the dielectric layer 335 and a part of spacer 333 are etched back to expose a part of the conductive lines, such as the top and partial sides of the conductive layer 330. A part of the dielectric layer 335 is retained on the top of the conductive layer 336 and above the doping regions 312.

Figure 19:
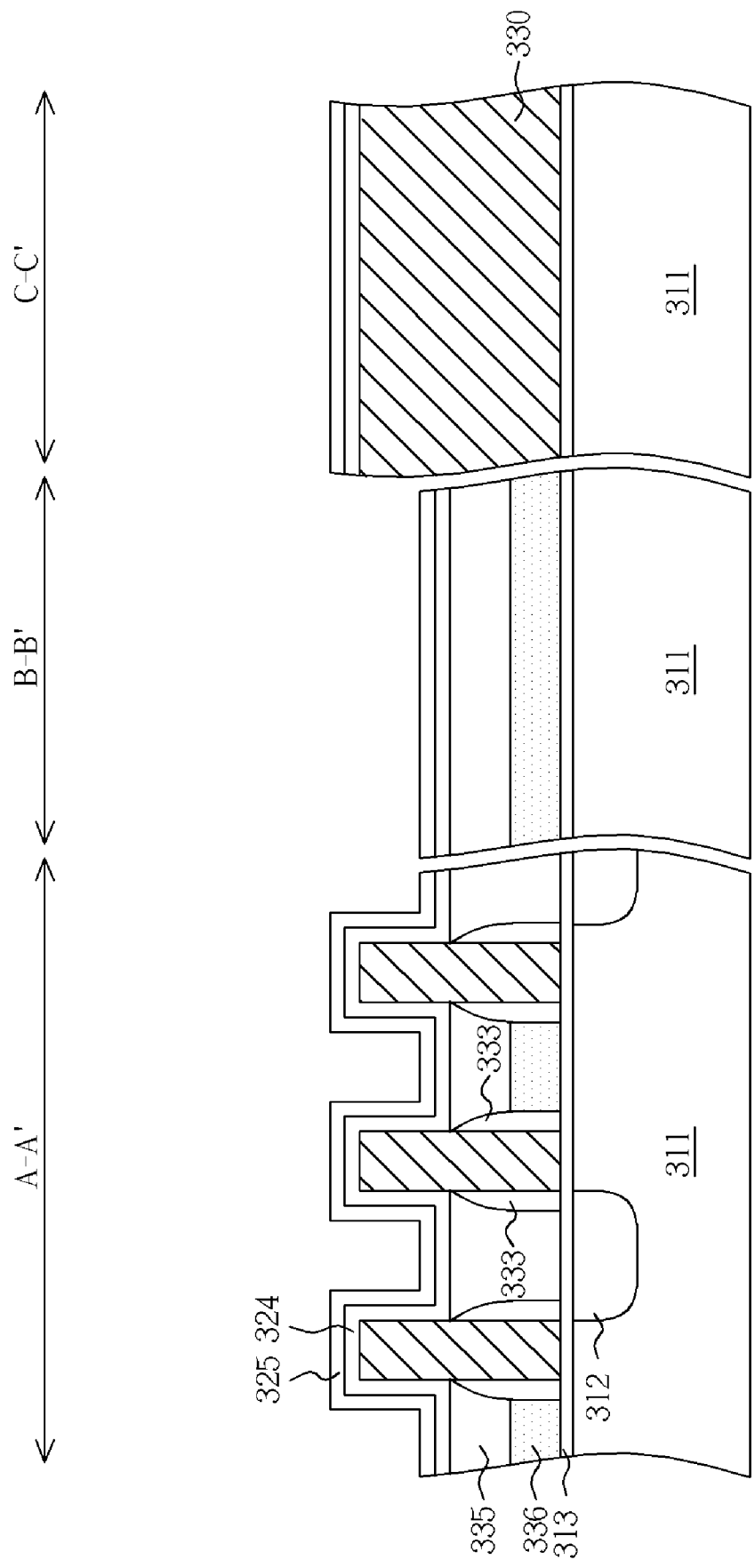
Figure 20:
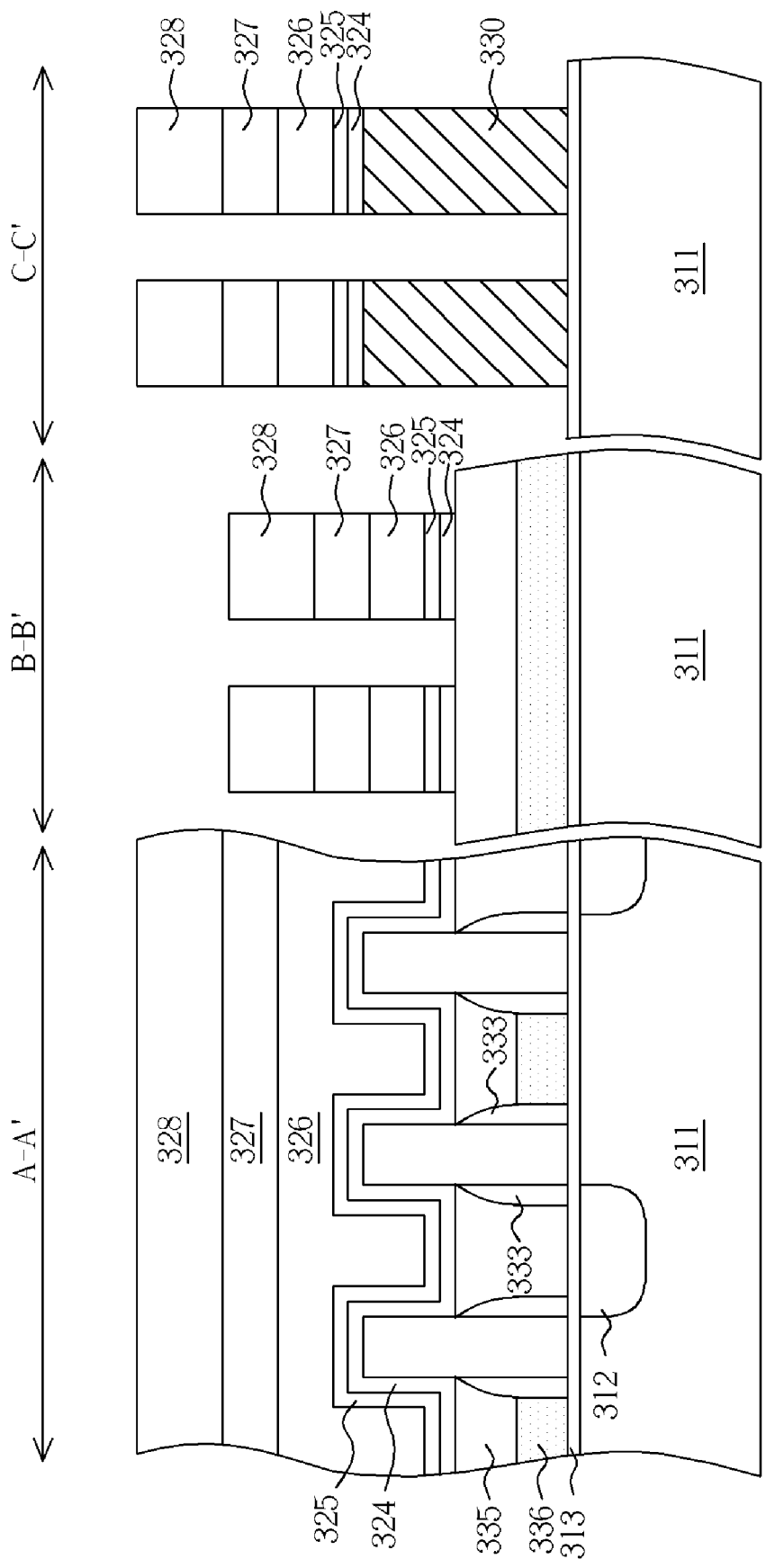

As shown in FIG. 19, a dielectric layer 324, which may comprise oxide/nitride/oxide, is deposited on the exposed top and partial sides of the conductive layer 330 of the conductive lines and the dielectric layer 335. Subsequently, a cap layer 325, which may comprise polysilicon, may be further deposited on the dielectric layer 324. As shown in FIG. 20, finally, a conductive layer, such as a polysilicon layer 326/WSi layer 327/SiN layer 328, is deposited on the dielectric layer 324 or the cap layer 325 and the SAMOS etching process is performed to pattern plurality of lines, such as word lines, perpendicular to the diffuse lines (doping regions 312). Simultaneously, the conductive lines defined from the conductive layer 330 are further defined as a plurality of conductive blocks for the function as floating gates. After the SAMOS etching process, the SiN layer 328 is removed.

It is noted that, in the second embodiment, the float gate is a single bulk of float gate and is first to be made in the manufacturing process.

A process for making a memory cell of the NMOS type in a third embodiment is exemplified as follows. The select gate is first to be made. FIGS. 21-27 show the cross-sectional diagrams of lines AA', BB', and CC' as shown in FIG. 5, respectively, during the manufacturing process for the memory structure.

Figure 21:
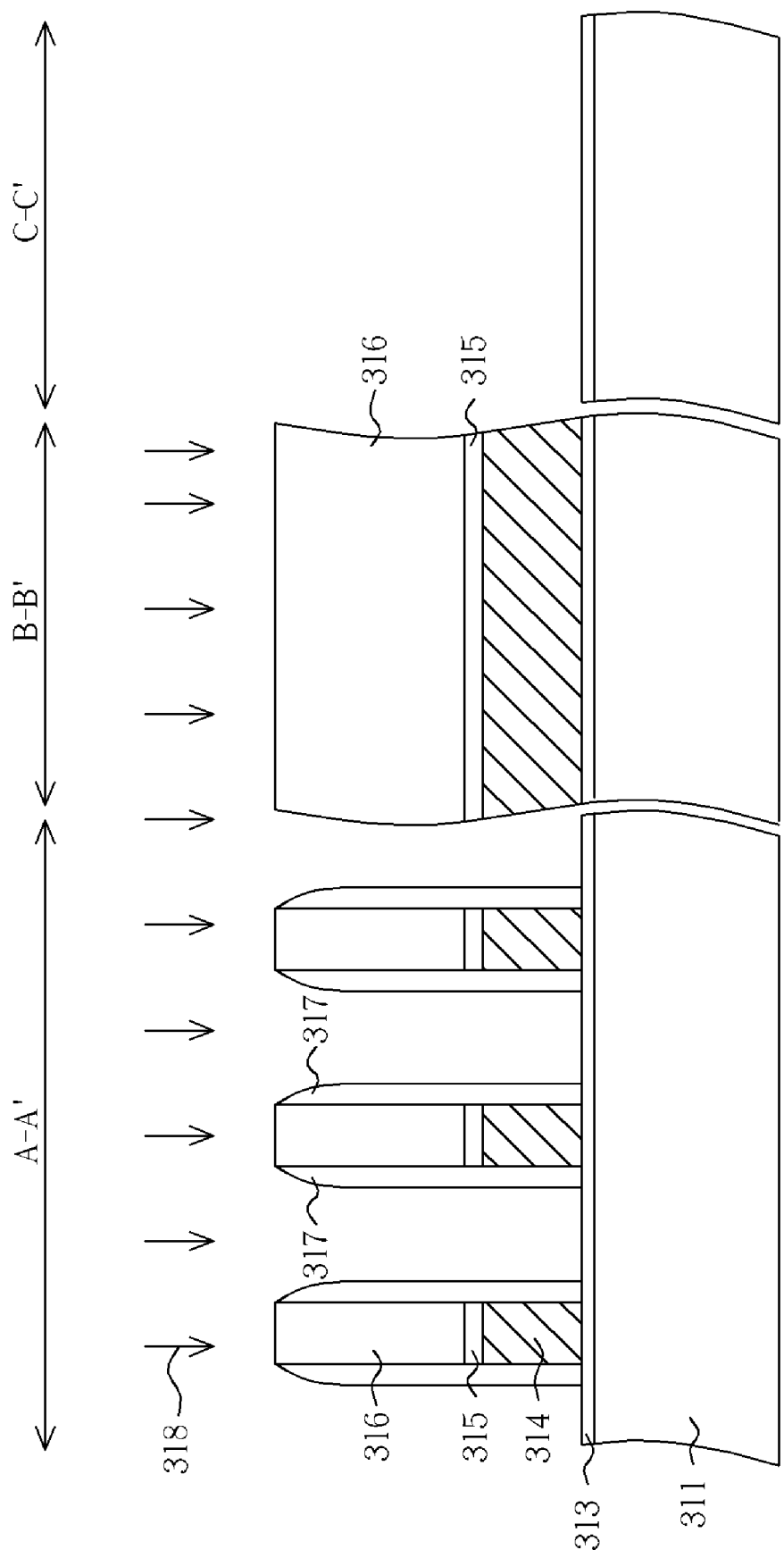
FIGS. 21 through 27 illustrate the processes of manufacturing the memory structure in still another embodiment according to the present invention.

FIG. 21 shows, after a gate dielectric layer 313, a conductive layer 314, and a cap layer of TEOS 315 and a cap layer of SiN 316 as a mask layer are sequentially deposited on the semiconductor substrate, a plurality of conductive lines comprising a conductive layer 314, a cap layer of TEOS 315 and a cap layer of SiN 316 as a mask layer are patterned. The conductive lines will serve as select gates after the memory structure is formed. There are spacers 317 at the sides of the conductive lines. An ion implanting step 318 is performed to give the memory structure a threshold voltage.

Figure 22:
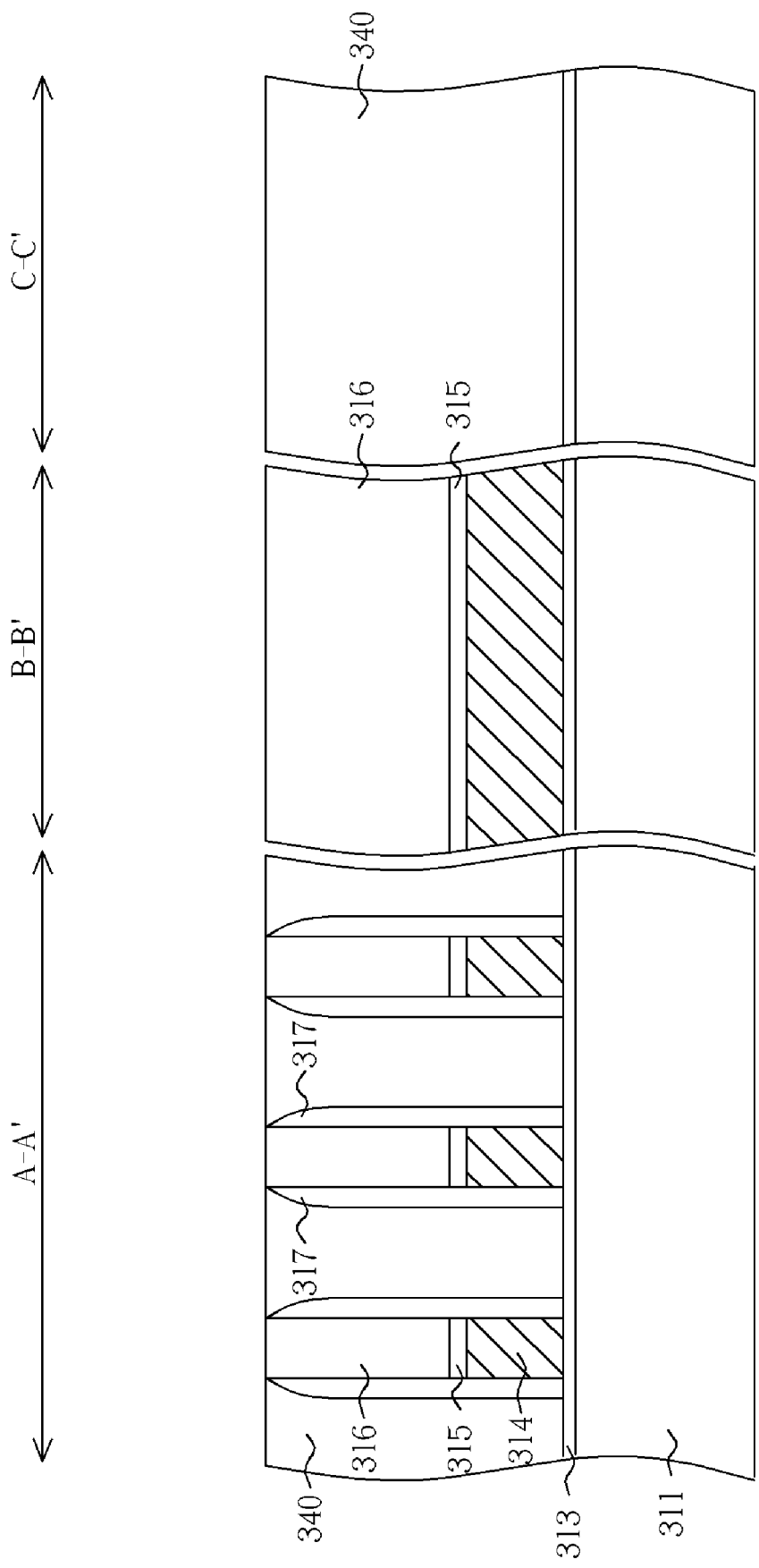

As shown in FIG. 22, a dielectric layer as a gate oxide layer may be further formed on the exposed semiconductor substrate for insulation of the select gate formed later on and the semiconductor substrate. Next, a conductive layer is deposited on the semiconductor substrate and the conductive lines, and chemically mechanically polished back using the top of the conductive lines as a stop layer. Thus, a conductive line 340 is formed to fill between the conductive lines consisting of a conductive layer 314, a cap layer 315, and a cap layer 316.

Figure 23:
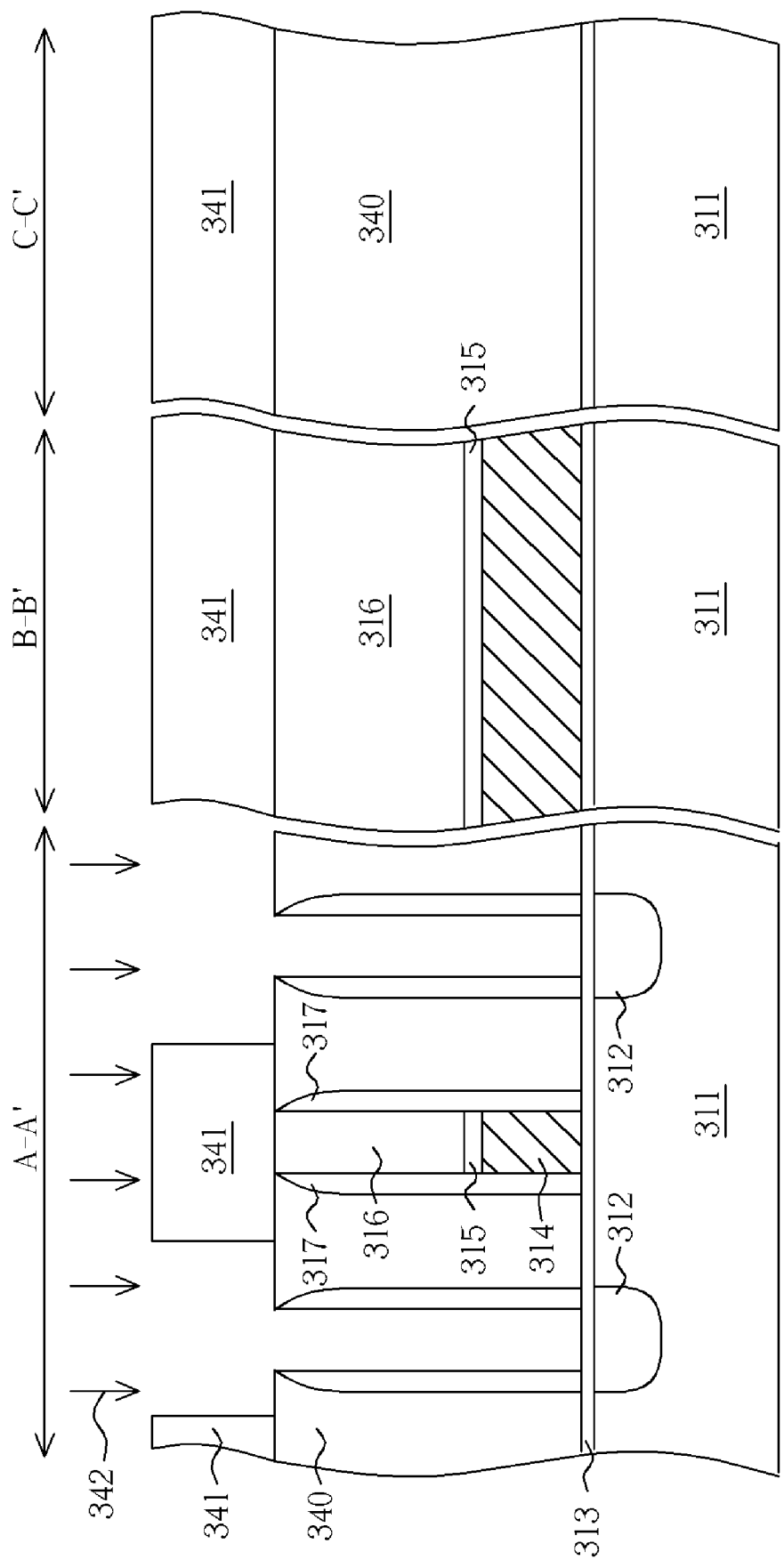

As shown in FIG. 23, a photo resist layer 341 is patterned to cover one of every two conductive lines consisting of a conductive layer 314, a cap layer 315, and a cap layer 316 and part of the adjacent conductive lines 340 for performing an etching process to remove the uncovered conductive lines. As a result, another one of the every two conductive lines is retained on the semiconductor substrate between every two conductive lines 340. Subsequently, an ion implantation 342, generally a N+ implantation, and an annealing are performed on the P-well 311 of the semiconductor substrate to form doping regions 312, such as buried diffusion regions or bit lines, in the semiconductor substrate. Subsequently, the photo resist layer 341 is stripped away. As a result, there are two lines of the conductive lines 340 and one conductive line 314 formed on the semiconductor substrate between two doping regions 312.

Figure 24:
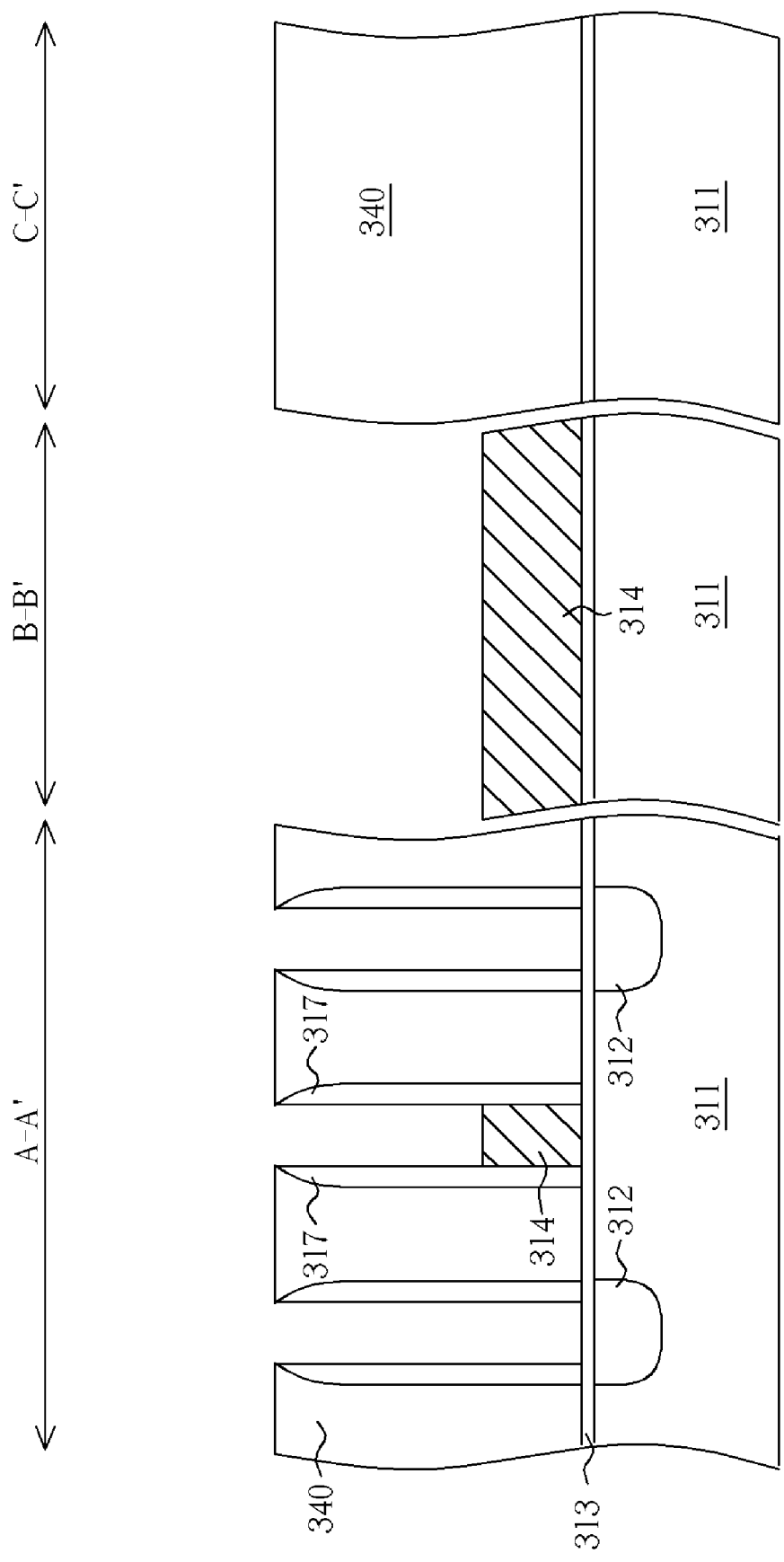
Figure 25:
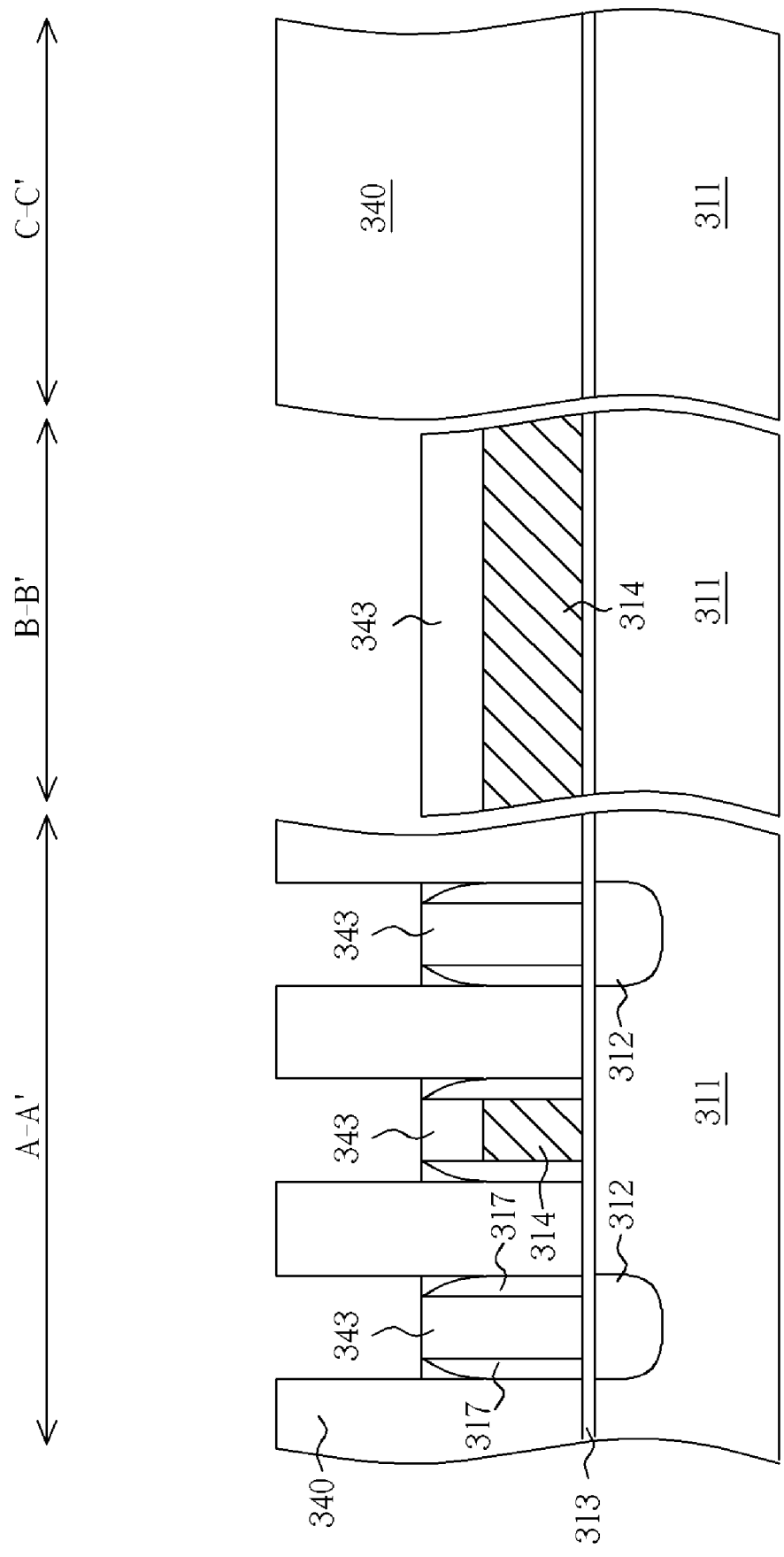

As shown in FIG. 24, the cap layer of TEOS 315 and the cap layer of SiN 316 of the conductive lines are removed using a wet etching process. Next, as shown in FIG. 25, a dielectric layer 343 is deposited over the conductive lines and the gate oxide layer on the substrate. Subsequently, the dielectric layer 343 is etched back and a portion of the spacers are also etched to expose a top and partial side surface of the conductive lines 340. A part of the dielectric layer 343 is retained on the top of the conductive layer 314 and above the doping regions 312.

Figure 26:
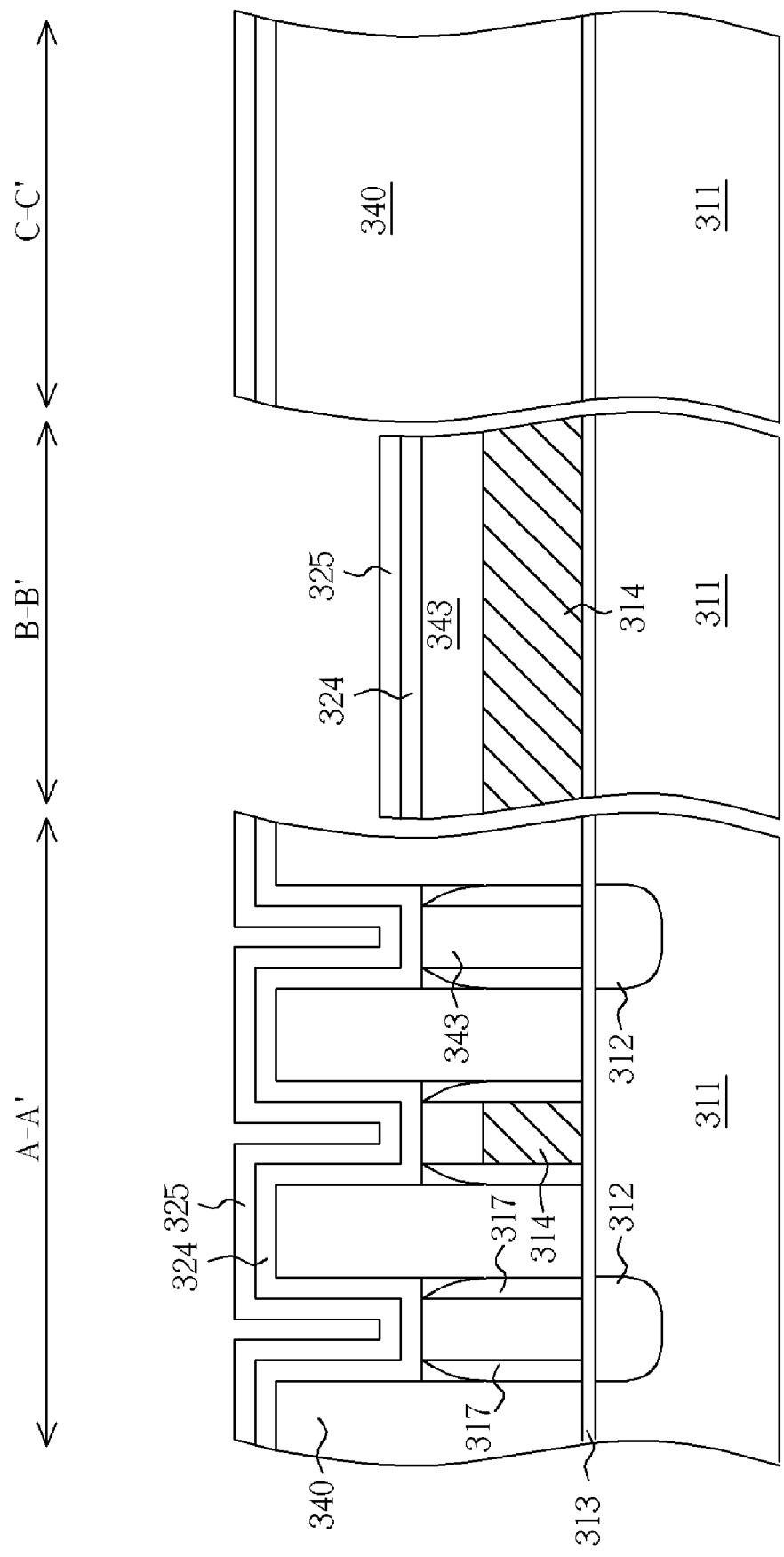
Figure 27:
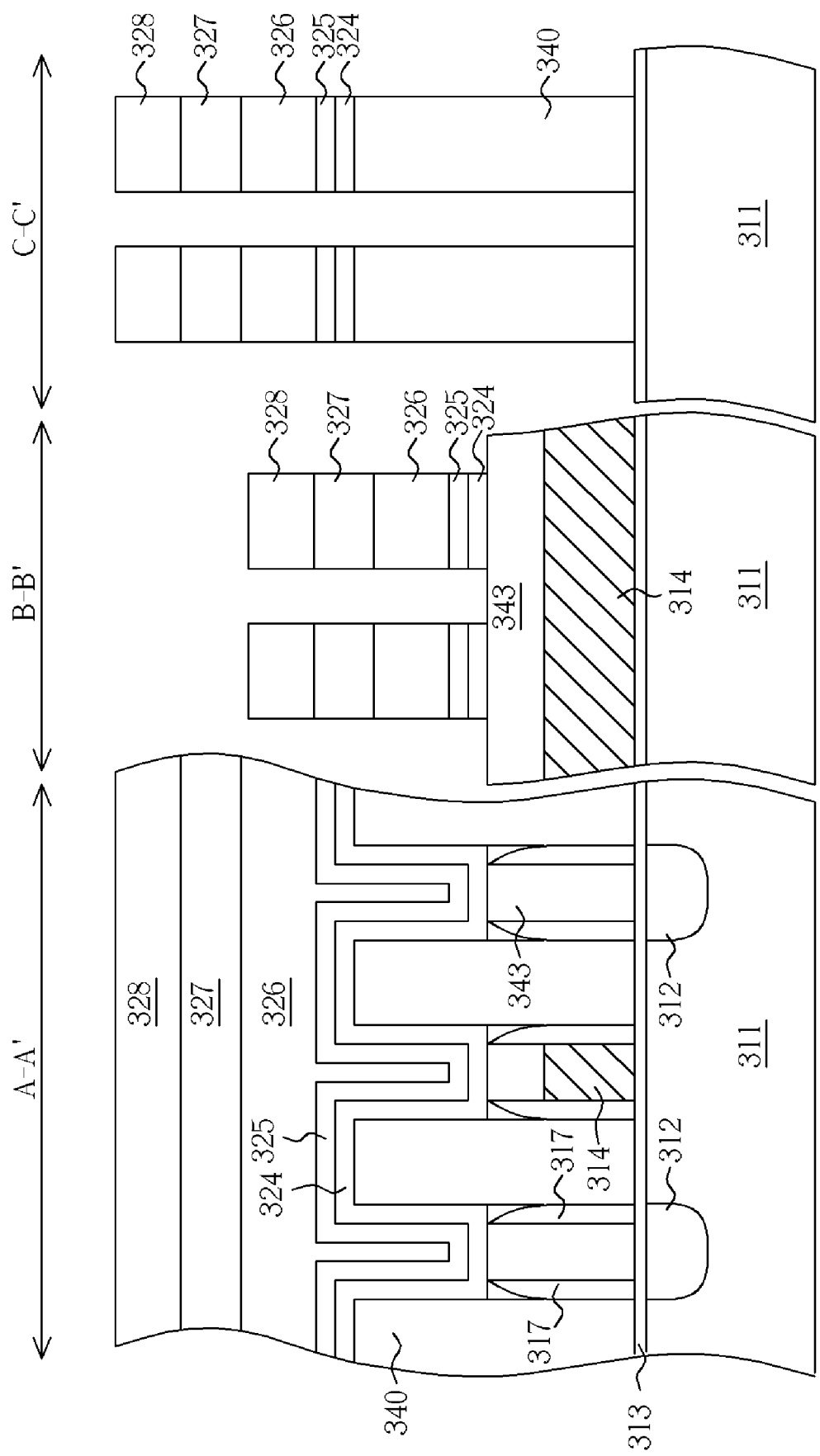

Subsequently, as shown in FIG. 26, a dielectric layer 324, which may comprise oxide/nitride/oxide, is deposited on the exposed top and partial sides of the conductive lines 340 and the dielectric layer 343. Subsequently, a cap layer 325, which may comprise polysilicon, may be further deposited on the dielectric layer 324. Finally, as shown in FIG. 27, a conductive layer, such as a polysilicon layer 326/WSi layer 327/SiN layer 328, is deposited on the dielectric layer 324 or the cap layer 325 and a SAMOS etching process is performed to pattern a plurality of lines, such as word lines, perpendicular to the diffuse lines (doping regions 312). Simultaneously, the conductive lines 340 are further defined as a plurality of conductive blocks for the function as floating gates. After the SAMOS etching process, the SiN layer 328 is removed.

It is noted that, in the third embodiment, the select gate is the first to be made in the manufacturing process.

According to the present invention, the floating gate has a raised height related to the select gates to get an increased ONO area effectively, thus the gate coupling ratio is improved. For example, ONO area which is 3 times larger than conventional one (typically 0.11×0.11 µm²) may guarantee the erase efficiency. Furthermore, there is a wide and thick dielectric layer (such as the dielectric layers 322, 335, and 343) between two memory structures, such that neighbor capacitance is small and can be ignored.

Operation Method

FIG. 6 illustrates a schematic diagram with reference to the split gate memory structure put forth in the present invention. The components are named by their functionality: a data line (bit line) is denoted by $DL_x$, a select gate is denoted by $SG_x$, and a word line is denoted by $WL_x$. Floating gate cells are denoted by $FG_x$, where the floating gate cells at two sides of a select gate $SG_2$ are denoted by $T_L$ and $T_R$, respectively. Examples for the reading, programming, and erasing of memory cells $T_L$ and $T_R$ are shown in FIG. 28. For instance, when programming $T_L$, $DL_2$ and $DL_3$ are 5V and 0V respectively, $WL_2$ is 12V, and $SG_2$ is 1V. Accordingly, $T_L$ and $T_R$ are turned on by the voltage of $WL_2$ coupling to $T_L$ and $T_R$, and $SG_2$ is turned on as well. Consequently, 5V bias is generated underneath floating gate $FG_1$. Therefore, electrons will jump into the storage cell of $T_L$ for programming.

For reading $T_L$, in addition to that of $WL_2$ and $SG_2$ are 5V and 3V respectively, and the $DL_3$ of 1.5V is intended to deplete the doping region of $DL_3$ so as to ignore the effect of $T_R$, i.e., regardless of whether $T_R$ is programmed or not. Accordingly, no current occurs if $T_L$ is programmed, and, in contrast, current occurs if $T_L$ is not programmed. This read operation uses so-called "reverse read" approach, i.e., to read the right hand side cell programmed or not, bias voltage is put on the left hand side bit line rather than the right hand side.

For erasing $T_L$, as shown in Erase (I) of FIG. 28, a highly negative voltage such as −18V is applied to $WL_2$ to expel electrons out of floating gate $FG_1$ and into the semiconductor substrate through the dielectric layer underneath. To avoid a very high negative voltage which causes a complex circuit design, a manner by partitioning voltage can be employed as shown in Erase (II). For instance, $DL_1$, $DL_2$, and $DL_3$ are 5V, and $WL_2$ is −10V. Therefore approximately −5V will be coupled to the $FG_1$ in the case of a 50% coupling ratio. Therefore, 10V bias is generated across the $FG_1$. Furthermore, the dielectric spacer between SG and FG may function also as a tunnel oxide, and the conductive line, such as $SG_2$, may function as an erase gate. Such erase conditions are listed in Erase (III). Further, to eliminate negative bias operation, a high positive bias applied to bulk, like 22V shown in Erase (IV), erased WL applied 0V, and other nodes are leaving floating, a voltage like 11V will be coupled to floating gate, and the tunnel oxide will have enough electrical field and pull out electron from the floating gate. For example, a preferable electric field to get a high speed erase is more than 13 MV/cm.

The programming, reading and erasing of $T_R$ is substantially the same as that of $T_L$, so that the detailed description is omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a memory array, comprising:
providing a semiconductor substrate;
forming a plurality of first conductive lines on the semiconductor substrate, wherein the first conductive lines comprise a mask layer as an upper part and a first conductive layer as a lower part;
forming a spacer at each side wall of the first conductive lines;
forming a second conductive layer on the semiconductor substrate between every two first conductive lines to form a plurality of second conductive lines;
forming a plurality of diffused lines in the semiconductor substrate between the first conductive lines where no second conductive layers are formed;
depositing a first dielectric layer over the first conductive lines and the semiconductor substrate;
planarizing the first dielectric layer using the top of the first conductive lines as a stop layer;
removing the mask layer as the upper part of the first conductive lines;
filling a third conductive layer as the upper part on the lower part of the first conductive lines, wherein the first conductive line and the third conductive layer have a total thickness more than the thickness of the second conductive line;

removing a portion of the first dielectric layer to expose a top and partial side surface of the third conductive layer of the first conductive lines;

forming a second dielectric layer on the exposed top and partial side surface of the third conductive layer of the first conductive lines; and forming a fourth conductive layer on the second dielectric layer and patterning the fourth conductive layer to form a plurality of lines over the third conductive layer and the first conductive lines and perpendicular to the diffused lines and defining a plurality of conductive blocks from the third conductive layer and the first conductive lines.

2. The method of claim 1, before forming a plurality of first conductive lines on the semiconductor substrate, further comprising a step of forming a gate oxide layer on the semiconductor substrate.

3. The method of claim 2, wherein, forming a plurality of first conductive lines on the semiconductor substrate comprises steps of:

forming the first conductive layer on the gate oxide layer;
forming the mask layer on the first conductive layer; and
performing a photolithography process to remove a portion of the mask layer and a portion of the first conductive layer on the gate oxide layer to define the plurality of first conductive lines having the mask layer as the upper part and the first conductive layer as the lower part.

4. The method of claim 3, wherein the mask layer comprises a TEOS layer and a SiN layer.

5. The method of claim 1, before forming a second conductive layer on the semiconductor substrate, further comprising a step of forming a gate oxide layer on the semiconductor substrate.

6. The method of claim 5, wherein, forming a second conductive layer on the semiconductor substrate between every two first conductive lines comprises:

depositing the second conductive layer on the gate oxide layer on the substrate between the first conductive lines; and performing an etching process to remove the second conductive layer in a line between the first conductive lines other than the every two first conductive lines, thereby retaining the second conductive layer on the semiconductor substrate between every two first conductive lines to form a plurality of second conductive lines.

7. The method of claim 1, wherein the second dielectric layer comprises an oxide/nitride/oxide layer.

8. The method of claim 1, after forming a second dielectric layer, further comprising a step of forming a cap polysilicon layer on the second dielectric layer.

9. The method of claim 1, wherein the fourth conductive layer comprises a polysilicon layer and a tungsten silicide layer.

10. A method for forming a memory array, comprising:
providing a semiconductor substrate;
forming a plurality of first conductive lines on the semiconductor substrate, wherein the first conductive lines comprise a first conductive layer and a mask layer as a cap layer;
forming a spacer at each side wall of the first conductive lines;
forming a second conductive layer on the semiconductor substrate between every two first conductive lines to form a plurality of second conductive lines, wherein the second conductive line has a thickness less than the thickness of the first conductive layer;
forming a plurality of diffused lines in the semiconductor substrate between the first conductive lines where no second conductive layers are formed;
depositing a first dielectric layer over the first conductive lines and the semiconductor substrate;
planarizing the first dielectric layer using the top of the first conductive lines as a stop layer;
removing the mask layer as the upper part of the first conductive lines;
removing a portion of the first dielectric layer and a portion of the spacers to expose a top and partial side surface of the first conductive layer of the first conductive lines;
forming a second dielectric layer on the exposed top and partial side surface of the first conductive layer of the first conductive lines; and
forming a third conductive layer on the second dielectric layer and patterning the third conductive layer to form a plurality of lines over the first conductive lines and perpendicular to the diffused lines and defining a plurality of conductive blocks from the first conductive lines.

11. The method of claim 10, before forming a plurality of first conductive lines on the semiconductor substrate, further comprising a step of forming a gate oxide layer on the semiconductor substrate.

12. The method of claim 11, wherein, forming a plurality of first conductive lines on the semiconductor substrate comprises steps of:

forming the first conductive layer on the gate oxide layer;
forming the mask layer as a cap layer on the first conductive layer; and
performing a photolithography process to remove a portion of the mask layer and a portion of the first conductive layer on the gate oxide layer to define the plurality of first conductive lines having the first conductive layer and the mask layer as a cap layer.

13. The method of claim 10, before forming a second conductive layer on the semiconductor substrate, further comprising a step of forming a gate oxide layer on the semiconductor substrate.

14. The method of claim 13, wherein, forming a second conductive layer on the semiconductor substrate between every two first conductive lines comprises:

depositing the second conductive layer on the substrate between the first conductive lines; and performing an etching process to remove the second conductive layer in a line between the first conductive lines other than the every two first conductive lines, thereby retaining the second conductive layer on the semiconductor substrate between every two first conductive lines to form a plurality of second conductive lines.

15. The method of claim 10, after forming a second dielectric layer, further comprising a step of forming a cap polysilicon layer on the second dielectric layer.

16. The method of claim 10, wherein the third conductive layer comprises a polysilicon layer and a tungsten silicide layer.

17. A method for forming a memory array, comprising:
providing a semiconductor substrate;
forming a plurality of first conductive lines on the semiconductor substrate, wherein the first conductive lines comprise a mask layer as an upper part and a first conductive layer as a lower part;
forming a spacer at each side of the first conductive lines;
filling a second conductive layer between the first conductive lines to form a plurality of second conductive lines, wherein each second conductive line has a top surface as high as the top surface of the mask layer of the first conductive lines;

removing one of every two first conductive lines;

forming a plurality of diffused lines in the semiconductor substrate between the second conductive lines where no first conductive lines are formed;

removing the mask layer as an upper part of the first conductive lines;

depositing a first dielectric layer over the second conductive lines, the first conductive layer of the first conductive lines, and the semiconductor substrate, and etching a portion of the dielectric layer back and a portion of the spacers to expose a top and partial side surface of the second conductive lines;

forming a second dielectric layer on the exposed top and partial side surface of the second conductive lines; and forming a third conductive layer on the second dielectric layer and patterning the third conductive layer to form a plurality of lines over the second conductive lines and perpendicular to the diffused lines, and defining a plurality of conductive blocks form the second conductive lines.

18. The method of claim 17, before defining a plurality of first conductive lines on the semiconductor substrate, further comprising a step of forming a gate oxide layer on the semiconductor substrate.

19. The method of claim 18, wherein, defining a plurality of first conductive lines on the semiconductor substrate comprises steps of:

forming the first conductive layer on the gate oxide layer;

forming the mask layer on the first conductive layer; and performing a photolithography process to remove a portion of the mask layer and a portion of the first conductive layer on the gate oxide layer to define the plurality of first conductive lines having the mask layer as the upper part and the first conductive layer as the lower part.

20. The method of claim 17, before filling a second conductive layer on the semiconductor substrate, further comprising a step of forming a gate oxide layer on the semiconductor substrate.

21. The method of claim 17, wherein the second dielectric layer comprises an oxide/nitride/oxide layer.

22. The method of claim 17, after forming a second dielectric layer, further comprising a step of forming a cap polysilicon layer on the second dielectric layer.

23. The method of claim 17, wherein the third conductive layer comprises a polysilicon layer and a tungsten silicide layer.

* * * * *